(12) United States Patent
Mitani et al.

(10) Patent No.: US 8,592,892 B2
(45) Date of Patent: Nov. 26, 2013

(54) NONVOLATILE SEMICONDUCTOR MEMORY DEVICE AND METHOD FOR MANUFACTURING THE SAME

(75) Inventors: Yuichiro Mitani, Kanagawa-ken (JP);
Masahiro Koike, Yokohama (JP);
Yasushi Nakasaki, Yokohama (JP);
Daisuke Matsushita, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 667 days.

(21) Appl. No.: 11/898,603

(22) Filed: Sep. 13, 2007

(65) Prior Publication Data
US 2008/0135922 A1   Jun. 12, 2008

(30) Foreign Application Priority Data
Dec. 8, 2006  (JP) ................................. 2006-332313

(51) Int. Cl.
*H01L 29/66* (2006.01)
(52) U.S. Cl.
USPC .................................. 257/325; 257/E29.309
(58) Field of Classification Search
USPC .................. 257/315, 321, 324, 325, E29.304, 257/E29.309
See application file for complete search history.

(56) References Cited

U.S. PATENT DOCUMENTS

| | | | |
|---|---|---|---|
| 4,939,559 A | | 7/1990 | DiMaria et al. |
| 6,117,756 A | * | 9/2000 | Wu ................. 438/594 |
| 6,331,953 B1 | * | 12/2001 | Wang et al. ........... 365/185.29 |
| 7,411,243 B2 | * | 8/2008 | Park et al. ...................... 257/315 |
| 7,436,018 B2 | * | 10/2008 | Bhattacharyya ............... 257/315 |
| 7,728,379 B2 | | 6/2010 | Konno et al. |
| 2005/0101102 A1 | * | 5/2005 | Chan et al. ..................... 438/451 |
| 2006/0077743 A1 | * | 4/2006 | Jeon et al. ...................... 365/222 |
| 2006/0198190 A1 | * | 9/2006 | Lue ........................ 365/185.12 |

(Continued)

FOREIGN PATENT DOCUMENTS

| | | |
|---|---|---|
| JP | 08-125042 | 5/1996 |
| JP | 2004-336044 | 11/2004 |
| JP | 2005-039138 | 2/2005 |
| JP | 2005-39138  A | 2/2005 |
| JP | 2005-228760 | 8/2005 |

OTHER PUBLICATIONS

Uchino, T. et al., "Mechanism of Electron Trapping in Ge-Doped $SiO_2$ Glass," Applied Physics Letters, vol. 79, No. 3, pp. 359-361, (Jul. 16, 2001).

(Continued)

*Primary Examiner* — Ha Nguyen
*Assistant Examiner* — Vongsavanh Sengdara
(74) *Attorney, Agent, or Firm* — Finnegan, Henderson, Farabow, Garrett & Dunner, L.L.P.

(57) ABSTRACT

A nonvolatile semiconductor memory device includes: a memory element, the memory element including: a semiconductor substrate; a first insulating film formed on a region in the semiconductor substrate located between a source region and a drain region, and having a stack structure formed with a first insulating layer, a second insulating layer, and a third insulating layer in this order, the first insulating layer including an electron trapping site, the second insulating layer not including the electron trapping site, and the third insulating layer including the electron trapping site, and the electron trapping site being located in a position lower than conduction band minimum of the first through third insulating layers while being located in a position higher than conduction band minimum of a material forming the semiconductor substrate; a charge storage film formed on the first insulating film; a second insulating film formed on the charge storage film; and a control gate electrode formed on the second insulating film.

18 Claims, 19 Drawing Sheets

(56) References Cited

U.S. PATENT DOCUMENTS

| | | | |
|---|---|---|---|
| 2007/0045718 A1* | 3/2007 | Bhattacharyya | 257/324 |
| 2007/0253256 A1* | 11/2007 | Aritome | 365/185.24 |
| 2008/0073691 A1* | 3/2008 | Konno et al. | 257/315 |

OTHER PUBLICATIONS

Dimaria, D. J. et al., "Enhanced Conduction and Minimized Charge Trapping in Electrically Alterable Read-Only Memories Using Off-Stoichionmetric Silicon Dioxide Films," J. appl. Phys., vol. 55, No. 8, pp. 3000-3019, (Apr. 15, 1984).

Notification of Reasons for Rejection mailed on Feb. 27, 2009, by the Japanese Patent Office in copending Application No. 2006-332313 and English language translation thereof.

Notice of Preliminary Rejection mailed on Jul. 31, 2009, by the Korean Patent Office in copending Korean Application No. 10-2007-126712 and English language translation thereof.

Gös et al, First-Principles Investigation on Oxide Trapping, *Simulation of Semi. Processes and Devices*, V. 12, pp. 157-160 (Sep. 2007).

\* cited by examiner

WHEN DATA IS RETAINED

WHEN WRITING/ERASING IS PERFORMED

WHEN DATA IS RETAINED

WHEN WRITING/ERASING IS PERFORMED

8,592,892 B2

NONVOLATILE SEMICONDUCTOR MEMORY DEVICE AND METHOD FOR MANUFACTURING THE SAME

CROSS-REFERENCE TO RELATED APPLICATION

This application is based upon and claims the benefit of priority from prior Japanese Patent Application No. 2006-332313 filed on Dec. 8, 2006 in Japan, the entire contents of which are incorporated herein by reference.

BACKGROUND OF THE INVENTION

1. Field of the Invention

The present invention relates to a nonvolatile semiconductor memory device and a method for manufacturing the nonvolatile semiconductor memory device.

2. Related Art

In recent years, memory elements have been rapidly becoming smaller in nonvolatile semiconductor memory devices such as EEPROMs (Electrically Erasable and Programmable Read Only Memories) in which writing and erasing can be electrically performed. In a case of an EEPROM, a high voltage is applied to the control gate electrode, so that electrons are injected into the floating gate electrode from the substrate side through a tunnel insulating film containing silicon (writing), or electrons are pulled out of the floating gate electrode (erasing) (see JP-A 08-125042 (KOKAI), for example). The floating gate electrode is located below the control gate electrode, with an interelectrode insulating film (also referred to as an interpoly insulating film) being interposed in between.

In such a case, a high voltage is required for injecting and pulling electrons into and out of the floating gate electrode, and large stress is caused in the tunnel insulating film. As a result, defects such as traps are formed in the tunnel insulating film, and the leakage current (stress-induced leakage current) increases and degrades the data retention characteristics and the likes.

The defects in the tunnel insulating film that cause the leakage current are formed, because a large amount of energy is generated due to the voltage application when the electrons in the silicon atoms tunnel through the conduction band of the tunnel insulating film to the cathode side. More specifically, when the tunneling electrons having the energy depending on the applied voltage move to the cathode side, impact ions are generated on the cathode side, and holes with a large amount of energy are generated or the hydrogen bonding existing in the silicon interfaces is cut off by the impact ions, resulting in the defects in the tunnel insulating film. The defects then cause leakage current and insulation breakdown.

To restrain the generation of defects in the tunnel insulating film, it is necessary to lower the voltage to be applied, or the write/erase voltage, and to reduce the energy of electrons to be injected. To effectively achieve those effects, the film thickness of the tunnel insulating film should be reduced. In a case where electrons form a FN (Fowler-Nordheim) tunneling current and pass through the tunnel insulating film, the amount of electrons injected J is generally expressed as:

$$J = A \times E_{ox}^2 \times \exp(-B/E_{ox})$$

where A and B represent constants that are determined by the electron effective mass in the insulating film and the energy barrier, and $E_{ox}$ represents the electric field ($=V_{ox}/t_{ox}$) to be induced in the tunnel insulating film. Accordingly, in a case where the tunnel insulating film having a film thickness $t_{ox}$ of 8 nm is thinned to a 7-nm thick film, a decrease of approximately 12.5% is expected in the voltage required for injecting and pulling electrons into and out of the floating gate electrode. With this fact being taken into account, thinning the tunnel insulating film is effective in lowering the write/erase voltage (the program voltage).

Also, in a case where a high electric field is induced in the control gate electrode, and electrons are exchanged between the floating gate electrode and the substrate as in a NAND flash memory, a high electric field is induced in the interelectrode insulating film located between those electrodes. Where the devices are made smaller, the electric field to be induced into the interelectrode insulating film becomes larger, and causes a serious problem in reliability, unless the program voltage can be lowered. Therefore, it is necessary to lower the program voltage.

Meanwhile, it is known that the stress-induced leakage current increases, as the film thickness is made smaller. Although a thickness reduction can lower the voltage for erasing, the probability of electrons tunneling through the traps formed in the tunnel insulating film is increased by the thickness reduction. Therefore, the leakage current increases, despite a decrease in the number of defects. In this manner, the thickness reduction and the reliability are in a trade-off relationship, which is a significant cause of the hindrance to a decrease in film thickness of the tunnel oxide film.

As described above, there is the trade-off problem with a nonvolatile semiconductor memory device such as an EEPROM in which a reduction of the film thickness of the tunnel insulating film is effective in lowering the program voltage, but traps are formed when a high voltage is applied at the time of writing/erasing, resulting in an increase in leakage current. Therefore, a tunnel insulating film that restrains the stress-induced leakage current while lowering the program voltage has been demanded. However, it has been very difficult to satisfy such demand by conventional techniques.

SUMMARY OF THE INVENTION

The present invention has been made in view of these circumstances, and an object thereof is to provide a nonvolatile semiconductor memory device that can lower the program voltage while reducing the stress-induced leakage current, and a method for manufacturing such a nonvolatile semiconductor memory device.

A nonvolatile semiconductor memory device according to a first aspect of the present invention includes: a memory element, the memory element including: a semiconductor substrate; a source region and a drain region formed at a distance from each other in the semiconductor substrate; a first insulating film formed on a region in the semiconductor substrate located between the source region and the drain region, and having a stack structure formed with a first insulating layer, a second insulating layer, and a third insulating layer in this order, the first insulating layer including an electron trapping site, the second insulating layer not including the electron trapping site, the third insulating layer including the electron trapping site, and the electron trapping site being located in a position lower than conduction band minimum of the first through third insulating layers while being located in a position higher than conduction band minimum of a material forming the semiconductor substrate; a charge storage film formed on the first insulating film; a second insulating film formed on the charge storage film; and a control gate electrode formed on the second insulating film.

A nonvolatile semiconductor memory device according to a second aspect of the present invention includes: a memory element, the memory element including: a silicon semiconductor substrate; a source region and a drain region formed at a distance from each other in the silicon semiconductor substrate; a first insulating film formed on a region in the silicon semiconductor substrate located between the source region and the drain region, and having a stack structure formed with a first insulating layer, a second insulating layer, and a third insulating layer in this order, the first through third insulating layers being formed with silicon and oxygen, or formed with silicon, oxygen, and nitrogen, the first and third insulating layers containing at least one element selected from the group consisting of germanium, arsenic and phosphorus; a charge storage film formed on the first insulating film; a second insulating film formed on the charge storage film; and a control gate electrode formed on the second insulating film.

A method for manufacturing a nonvolatile semiconductor memory device according to a third aspect of the present invention includes: forming a first insulating layer on a semiconductor substrate, the first insulating layer having an electron trapping site; forming a second insulating layer on the first insulating layer, the second insulating layer not having the electron trapping site; and forming a third insulating layer on the second insulating layer, the third insulating layer having the electron trapping site.

A method for manufacturing a nonvolatile semiconductor memory device according to a fourth aspect of the present invention includes: depositing a first silicon film on a silicon semiconductor substrate, the first silicon film containing at least one additive element selected from the group consisting of germanium, arsenic and phosphorus; forming a first insulating layer by oxidizing, nitriding or oxynitriding the first silicon film; depositing a second silicon film on the first insulating layer; forming a second insulating layer by oxidizing, nitriding or oxynitriding the second silicon film; depositing a third silicon film on the second insulating layer, the third silicon film containing at least one additive element selected from the group consisting of germanium, arsenic, and phosphorus; and forming a third insulating layer by oxidizing, nitriding or oxynitriding the third silicon film.

DETAILED DESCRIPTION OF THE INVENTION

The following is a detailed description of embodiments of the present invention, with reference to the accompanying drawings.

(First Embodiment)

Figure 1:
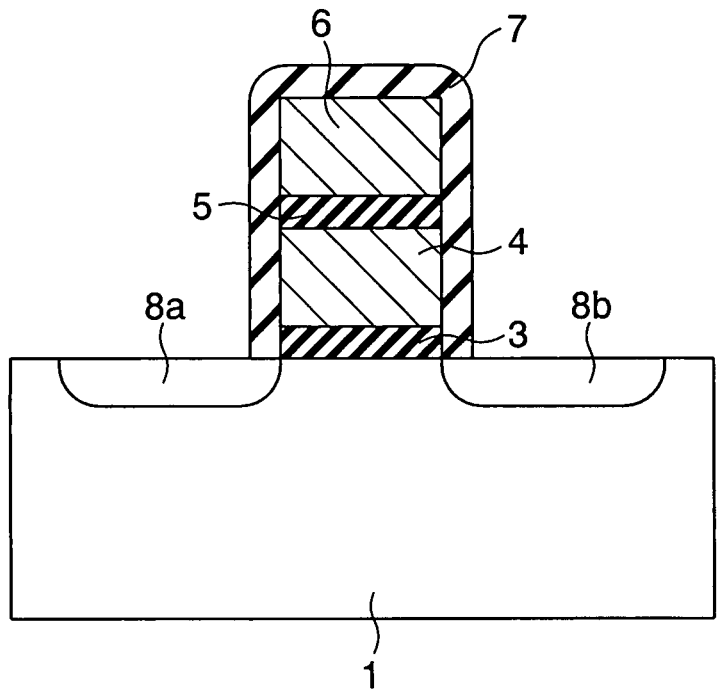
FIG. 1 is a cross-sectional view showing a memory element of a nonvolatile semiconductor memory device according to a first embodiment.

A nonvolatile semiconductor memory device in accordance with a first embodiment of the present invention includes NAND cell units arranged in a matrix form. Each of the NAND cell units includes a NAND cell formed with memory cells connected in series. Each of the memory elements has an n-type source region 8a and drain region 8b formed at a distance from each other on a p-type silicon substrate 1, as shown in FIG. 1. The n-type source region 8a and drain region 8b contain n-type impurities (such as phosphorus). A tunnel insulating film 3 is formed on a portion of the silicon substrate 1 located between the source region 8 and drain region 8b. A floating gate electrode 4 is formed on the tunnel insulating film 3. An interelectrode insulating film 5 is formed on the floating gate electrode 4. A control gate electrode 6 is formed on the interelectrode insulating film 5. The tunnel insulating film 3, the floating gate electrode 4, the interelectrode insulating film 5, and the control gate electrode 6 constitute the gate of the stack structure. A silicon oxide film 7 is formed on the upper face and the side faces of the gate.

Figure 2:
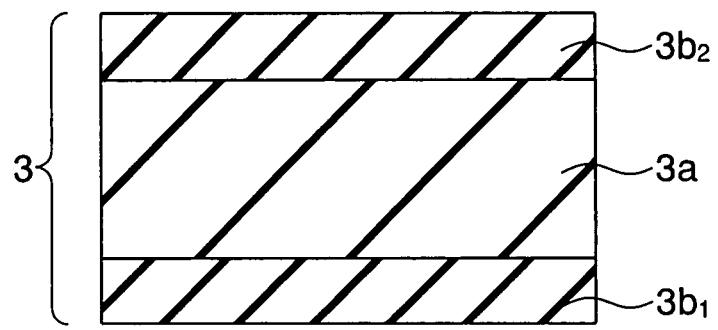
FIG. 2 is a cross-sectional view of a tunnel insulating film according to the first embodiment.
Figure 3A:
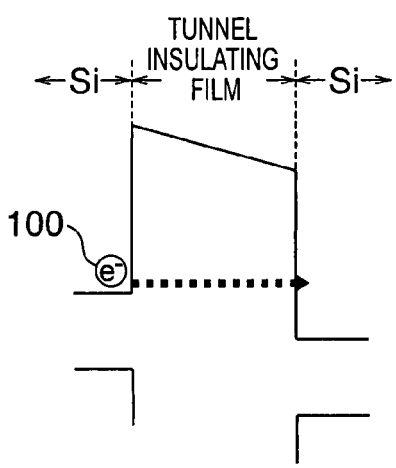
FIG. 3A and FIG. 3B are diagrams for explaining the tunneling current in Comparative Example 1.
Figure 3B:
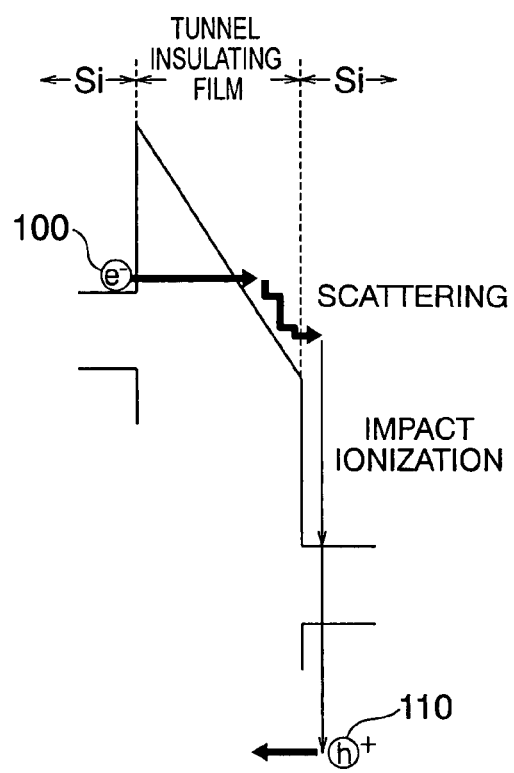

As shown in FIG. 2, the tunnel insulating film 3 has a stack structure consisting of a silicon oxide layer 1a not having an electron trapping site (an injection assisting site), and silicon oxide layers $3b_1$ and $3b_2$ that sandwich the silicon oxide layer $3a$ and each have an injection assisting level. In this structure, the silicon oxide layers $3b_1$ and $3b_2$ serve as injection assisting layers. The floating gate electrode 4 and the control gate electrode 6 are made of polycrystalline silicon, and the interelectrode insulating film 5 is a 7-nm thick ONO (Oxide-Nitride-Oxide) film 5 having a stack structure consisting of a silicon oxide layer, a silicon nitride layer, and a silicon oxide layer. The floating gate electrode 4 serves as a charge storage film in which charges are accumulated.

As Comparative Example 1, a nonvolatile semiconductor memory device having the same structure as this embodiment except that electron trapping sites are not formed in the tunnel insulating film is produced. Where electrons 100 are to pass through the tunnel insulating film in Comparative Example 1, it is necessary to apply a high voltage to the tunnel insulating film so as to cause the electrons 100 to tunnel through in the conduction band of the tunnel insulating film (or to generate a FN tunneling current). Here, according to the voltage to be supplied, the injected electrons 100 have a large amount of energy on the cathode side. When passing through the tunnel insulating film, the electrons 100 scatter in the tunnel insulating film, and destroy the structure of the tunnel insulating film. Alternatively, when reaching the silicon on the cathode side while retaining the large amount of energy, the electrons 100 turn into impact ions, and holes 110 that are generated by the impact ionization and have a large amount of energy diffuse into the tunnel insulating film, and destroy the structure of the insulating film, resulting in a defect that causes stress-induced leakage current.

Figure 4A:
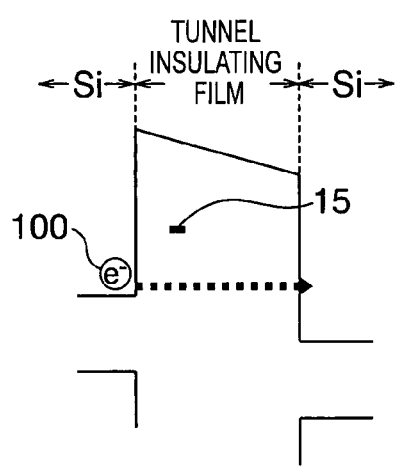
FIG. 4A and FIG. 4B are diagrams for explaining the effects of an injection assisting level according to the first embodiment.
Figure 4B:
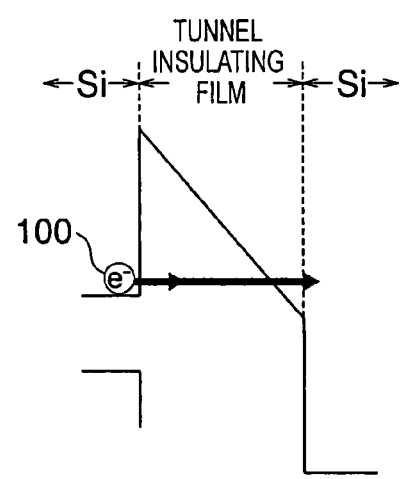

In this embodiment, on the other hand, electron trapping sites are formed in the tunnel insulating film 3. Accordingly, as shown in FIGS. 4A and 4B, electrons 100 start tunneling through via the electron trapping site 15 in the tunnel insulating film 3 with a lower applied voltage than in the case of Comparative Example 1, even though the tunnel insulating film 3 has the same physical film thickness as the tunnel insulating film of Comparative Example 1. Further, where charges are retained (data is retained), the electron trapping site 15 exists in a higher position than the conduction band of silicon (see FIG. 4A). Accordingly, the tunneling electrons 100 flowing via the electron trapping site 15 are restrained, and the same charge retention (data retention) properties as in Comparative Example 1 can be achieved.

Figure 5:
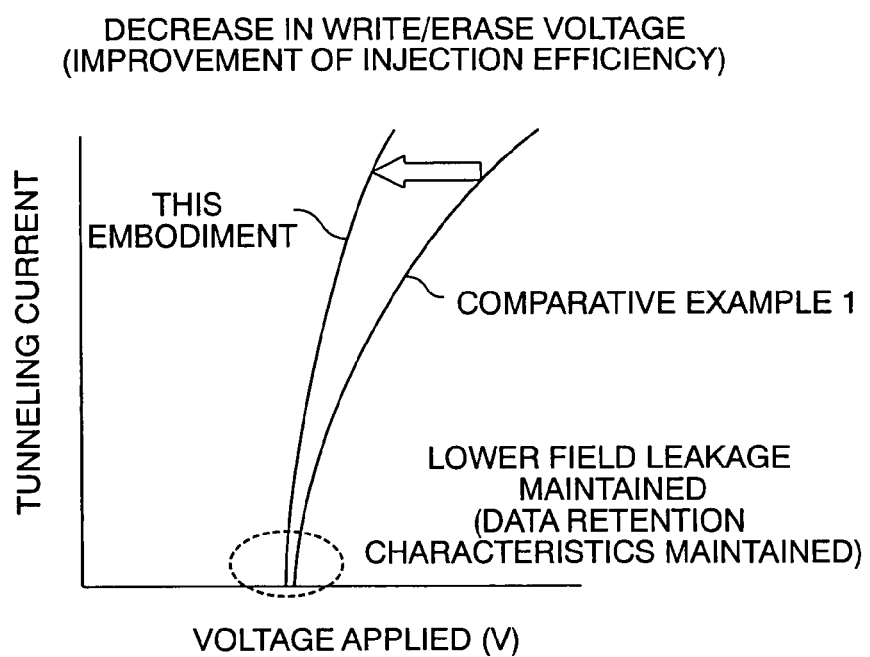
FIG. 5 shows the current-voltage characteristics of the first embodiment.

With the above facts being taken into account, the relationship between the tunnel current and the voltage applied to the tunnel insulating film, or the current-voltage characteristics, in this embodiment and Comparative Example 1 are as shown in FIG. 5. As can be seen from FIG. 5, in a low electric field region (a low applied voltage region), a value of the leakage current in this embodiment is almost the same as a value of the leakage current in the Comparative Example 1. And in a high electric field region (a high applied voltage region), an applied voltage in this embodiment is lower than that of the Comparative Example 1 in order to flow the current of the same value.

In this embodiment, the electron trapping site is provided between the conduction band of the tunnel insulating film 3 and the conduction band of silicon. If the electron trapping site is formed in a lower position than the conduction band of silicon, electrons easily flow due to trap-assisting tunneling in its own electric field when charges are retained (data is retained). Therefore, the electron trapping site needs to be provided between the conduction band of the tunnel insulating film and the conduction band of silicon, as in this embodiment.

If the tunnel insulating film has a stack structure consisting of a silicon oxide film, a silicon nitride film, and a silicon oxide film, or a stack structure consisting of a silicon oxide film (or a silicon nitride film), a high-permittivity film, and a silicon oxide film (or a silicon nitride film), the voltage required for writing/erasing can be lowered as in this embodiment. In such a case, however, the barrier heights for the silicon of the silicon oxide film, the silicon nitride film, and the high-permittivity film vary. In other words, the conduction band minimum of the tunnel insulating film is not constant. As a result, stable device characteristics cannot be achieved.

In this embodiment, on the other hand, the conduction band minimum of the tunnel insulating film 3 is constant in the film thickness direction. Accordingly, charges are not trapped in the vicinity of the interfaces of the respective stacked films, and stable device characteristics can be achieved in this embodiment as opposed to the case of a tunnel insulating film having a stack structure consisting of a silicon oxide film, a silicon nitride film, and a silicon oxide film, for example.

In this embodiment, the voltage (electric field) for writing/erasing can be lowered. Accordingly, the energy of electrons passing through the tunnel insulating film decreases, and formation of defects due to tunneling electrons in the tunnel insulating film can be restrained. Thus, the stress-induced leakage current can be reduced.

Figure 6:
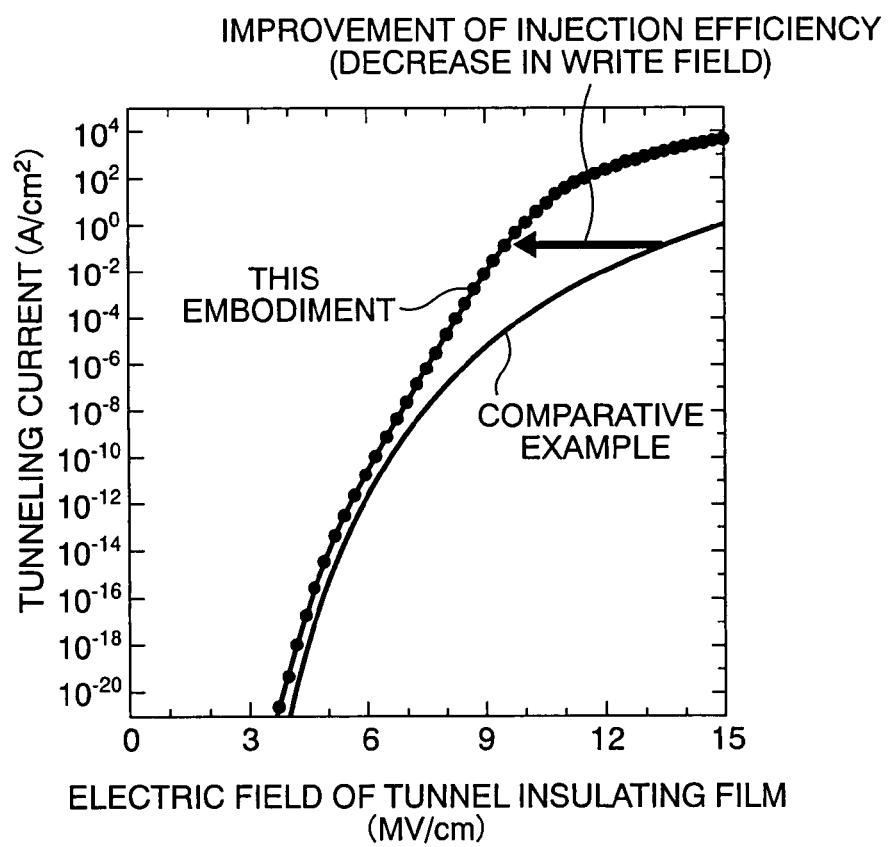
FIG. 6 shows the tunneling current-field characteristics of the tunnel insulating film according to the first embodiment.

FIG. 6 shows the dependence of the tunneling current on the electric field of the tunnel insulating film 3 where the film thickness of the silicon oxide layer $3a$ of the tunnel insulating film 3 is 6 nm, the film thickness of each of the silicon oxide layers $3b_1$ and $3b_2$ is 1 nm, and the depth $\phi_1$ of the electron trapping site of each of the silicon oxide layers $3b_1$ and $3b_2$ (or the energy depth from the conduction band minimum of the tunnel insulating film 3) is 2.0 eV. FIG. 6 also shows the dependence of the tunneling current on the tunnel insulating film of Comparative Example 1 where the film thickness of the tunnel insulating film formed with a silicon oxide film is 8 nm (which is the same physical film thickness as the tunnel insulating film 3 of this embodiment). As can be seen from FIG. 6, the amount of current with a high electric field for writing/erasing is larger, and the electric field for writing/erasing is lower accordingly in this embodiment than in Comparative Example 1, though the tunnel insulating films of this embodiment and Comparative Example 1 have the same film thickness. Where data is retained (charges are retained), the leakage current with an electric field of 4 MV/cm in this embodiment is substantially the same as in Comparative Example 1.

In the first embodiment, an electron trapping site, or an injection assisting level, is formed in each of the upper layer and the lower layer of the tunnel insulating film 3. In the following, Comparative Example 2 is described. In Comparative Example 2, an injection assisting level is formed evenly in the tunnel insulating film.

Figure 7:
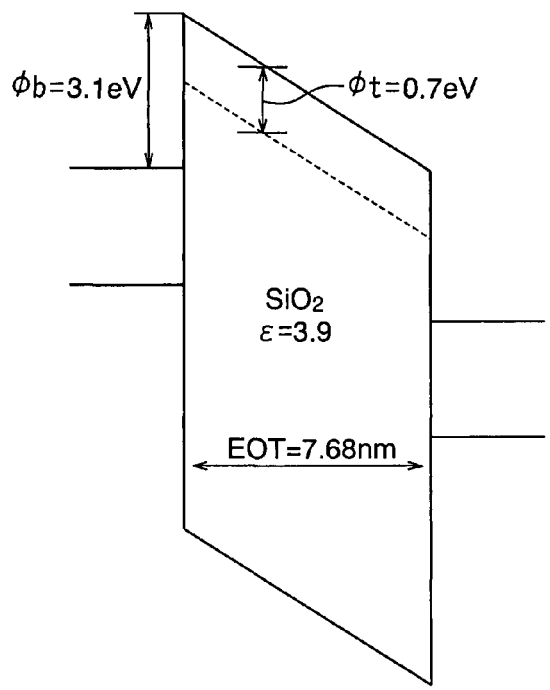
FIG. 7 is an energy band diagram of the tunnel insulating film having the injection assisting level existing uniformly in the film thickness direction.
Figure 8:
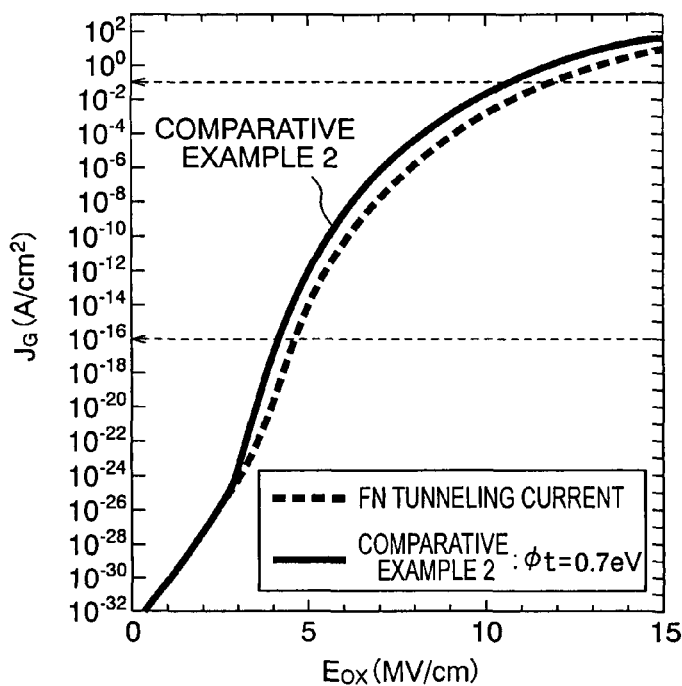
FIG. 8 shows the tunneling current-field characteristics of the tunnel insulating film having the injection assisting level existing uniformly in the film thickness direction.

The nonvolatile semiconductor memory device of Comparative Example 2 has the same structure as the nonvolatile semiconductor memory device of the first embodiment, except that the injection assisting level is formed evenly in the tunnel insulating film 3. FIG. 7 and FIG. 8 show the writing/erasing characteristics of the nonvolatile semiconductor memory device in accordance with Comparative Example 2. In the energy band diagram of FIG. 7, the film thickness of the tunnel insulating film made of $SiO_2$ is 7.68 nm, the energy barrier φb of the tunnel insulating film is 3.1 eV, the depth $\phi_1$ of the electron trapping site is 0.7 eV, and the permittivity ε of $SiO_2$ is 3.9. As shown in FIG. 7, when the conduction band minimum on the injection side matches the injection assisting level (the position of the electron trapping site), the current starts flowing via the trap (the trap-assisting tunneling current). Where the injection assisting level exists evenly in the tunnel insulating film as in Comparative Example 2, the amount of current invariably increases as shown in FIG. 8. In a case of a nonvolatile memory, the write voltage can be reduced, but the amount of current with an electric field for data retention (charge retention) such as an electric field of 4 MV/cm increases, resulting in degradation in data retention properties.

Figures 9A, 9B, 9C:
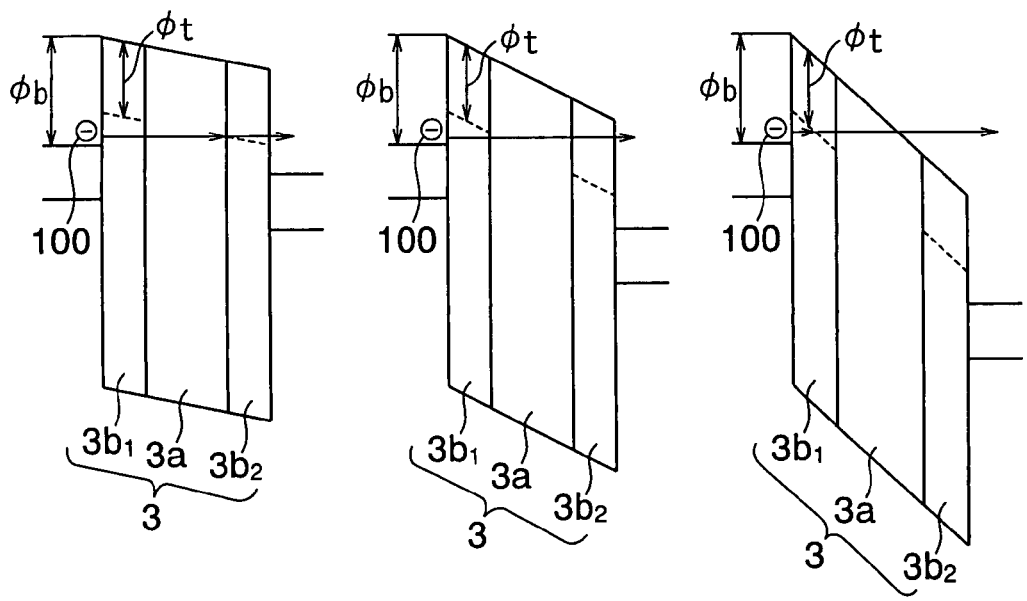
FIG. 9A through FIG. 9C illustrate changes in energy band observed with increases in electric field.
Figure 10:
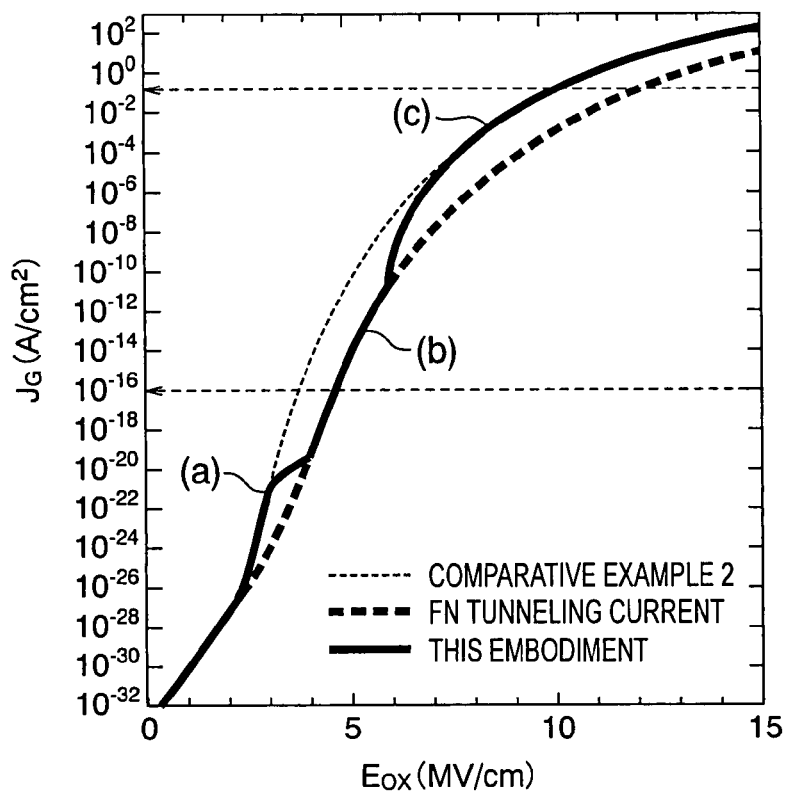
FIG. 10 shows the current-field characteristics in the case where the injection assisting level exists on either interface side of the tunnel insulating film.

In this embodiment, on the other hand, the injection assisting layers $3b_1$ and $3b_2$ are formed only in the two interface sides or the lower and upper layers of the tunnel insulating films 3, and the intermediate layer $3a$ does not have an electron trapping site. When the injection assisting level located on the anode side matches the conduction band minimum of the silicon on the injection side in this case, a trap-assisting tunneling current starts flowing (see FIG. 9A). When an electric field is further induced, the trap level (the injection assisting level) becomes lower than the silicon conduction band and stops functioning. As a result, a regular FN tunneling current flows, as shown in FIG. 9B. When the intensity of the electric field is further increased, the injection assisting level on the cathode side functions, and the trap-assisting tunneling current starts flowing, as shown in FIG. 9C. FIG. 10 shows the tunneling current ($J_G$)-field ($E_{ox}$) characteristics of the tunneling insulating films. In FIG. 10, the characteristics graphs (a), (b), and (c) of this embodiment correspond to FIGS. 9A, 9B, and 9C. The graph indicated by a thin broken line represents the current-field characteristics of Comparative Example 2.

As shown in FIG. 10, on the lower electric field side, an increase in current is observed due to the injection assisting level of the injection assisting layer $3b_2$ on the anode side. In this embodiment, however, the trap depth $\phi_t$ of each injection assisting level and the layer thicknesses of the injection assisting layers $3b_1$ and $3b_2$ at both interfaces including the injection assisting levels are optimized (as shown in FIG. 6, for example), so that an increase in current can be prevented in the electric field at the time of data retention. Here, the trap depths $\phi_t$ of the injection assisting levels and the layer thicknesses of the injection assisting layers $3b_1$ and $3b_2$ on the anode side and the cathode side are made uniform, but it is also possible to set different layer thicknesses and trap depths $\phi_t$. However, to obtain uniform write/erase characteristics, the layer thicknesses of the injection assisting layers $3b_1$ and $3b_2$ at both interfaces should be equal to the trap depths $\phi_t$ of the injection assisting levels.

In this embodiment, the tunnel insulating film 3 is formed with a silicon oxide film. However, the material of a tunnel insulating film is not limited to that, and the same effects as above can be achieved with a high-permittivity film (a high-k film) such as a silicon oxynitride film containing nitrogen, a silicon nitride film containing oxygen, a silicon nitride film, a hafnia film, a hafnium silicate film, an alumina film, a hafnium aluminate film, a lantern oxide film, or a lantern aluminate film.

The conduction band minimum of the tunnel insulating film 3 of this embodiment should preferably be uniform in the depth direction. The reason for this is as follows. If the barrier height of the intermediate layer $3a$ of the tunnel insulating film 3 is lower than the barrier height of the injection assisting layers $3b_1$ and $3b_2$ at both interfaces, the data retention properties shown in FIG. 10 and a decrease in write/erase field cannot be achieved. In other words, an increase in current in lower and middle electric fields degrades the charge retention properties, and charges are accumulated in the intermediate layer $3a$ due to the barriers of the injection assisting layers $3b_1$ and $3b_2$ at both interfaces. As a result, the desired characteristics cannot be obtained.

Figure 11:
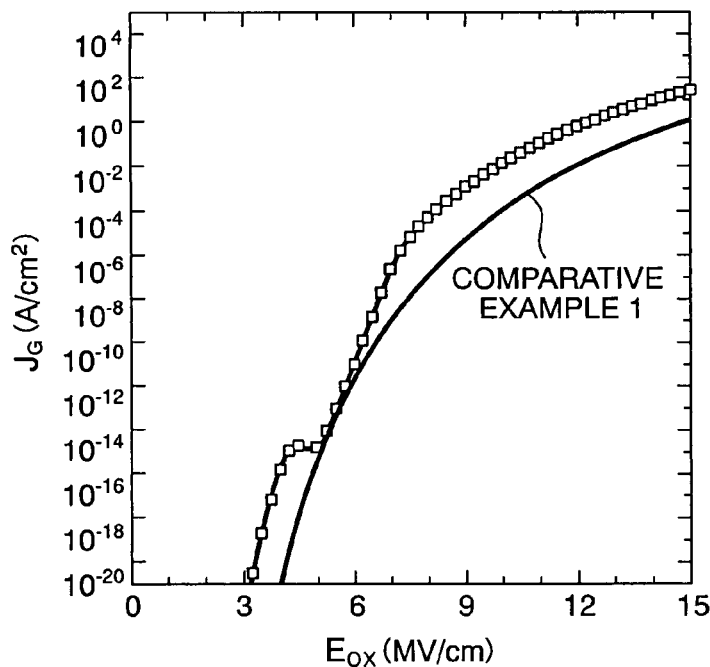
FIG. 11 shows the current-field characteristics in a case where the injection assisting layer exists on either interface side of the tunnel insulating film.
Figure 12:
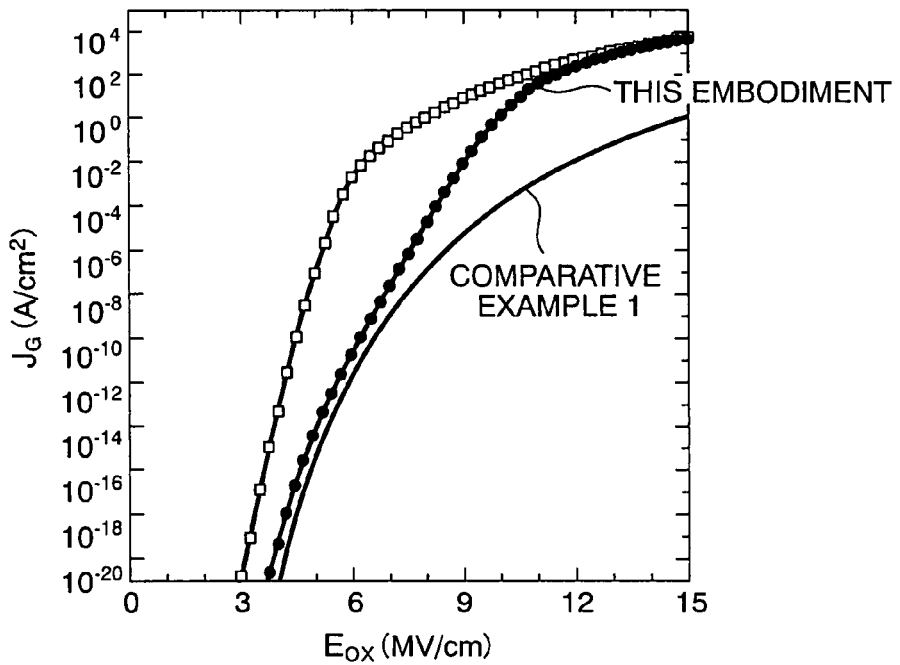
FIG. 12 shows the current-field characteristics in a case where the injection assisting layer exists on either interface side of the tunnel insulating film.

FIG. 11 and FIG. 12 show the current-field characteristics of the tunnel insulating film 3 made of $SiO_2$ in a case where the injection assisting layers $3b_1$ and $3b_2$ are thick and in a case where the injection assisting layers $3b_1$ and $3b_2$ are thin. In both cases, the total film thickness of the tunnel insulating film 3 is 8 nm. In the case where the layer thickness is large (in the case shown in FIG. 11), the layer thickness $t_{injector}$ of each of the injection assisting layers $3b_1$ and $3b_2$ is 3 nm, the trap depth $\phi_t$ of each injection assisting level is 1.2 eV, and the layer thickness of the intermediate layer $3a$ is 2 nm. In the case where the layer thickness is small (in the case shown in FIG. 12), the layer thickness $t_{injector}$ of each of the injection assisting layers $3b_1$ and $3b_2$ is 2 nm, the trap depth $\phi_t$ of each injection assisting level is 2.0 eV, and the layer thickness of the intermediate layer $3a$ is 4 nm.

As shown in FIG. 11, where the injection assisting layers $3b_1$ and $3b_2$ each have a large layer thickness, the electron injection efficiency on the higher electric field side is improved, and accordingly, the write/erase voltage can be lowered. However, the amount of current on the lower electric field side is increased, and the data retention (charge retention) characteristics are degraded. As shown in FIG. 12, where the injection assisting layers $3b_1$ and $3b_2$ each have a small layer thickness, the write/erase voltage can be lowered, as the electron injection efficiency on the higher electric field side. However, the leakage current on the lower electric field side is increased, and the data retention (charge retention) characteristics are degraded. In FIG. 12, the graph representing this embodiment is the same as the current-field graph shown in FIG. 6, where the layer thickness $t_{injector}$ of each of the injection assisting layers $3b_1$ and $3b_2$ is 1 nm, the trap depth $\phi_t$ of each injection assisting level is 2.0 eV, and the layer thickness of the intermediate layer $3a$ is 6 nm. The graph representing Comparative Example 1 is the same as the graph showing the current-field characteristics observed where no injection assisting layers are provided.

Accordingly, as described with reference to FIG. 6, in a case where the trap depth $\phi_t$ of each injection assisting level of the injection assisting layers $3b_1$ and $3b_2$ is 2 eV, and the layer thickness is 1 nm (in the case of this embodiment), the leakage current on the lower electric field side can be restrained, while the injection efficiency on the higher electric field side is increased.

As described above, to lower the write/erase field while increasing the electron injection efficiency, and to restrict the leakage current in a low electric field at the time of data retention to a value equal to or smaller than that of a conventional tunnel insulating film, the depth $\phi_t$ of each injection assisting level of the injection assisting layers $3b_1$ and $3b_2$ located on both interfaces of the tunnel insulating film and the layer thickness $t_{injector}$ of each of the injection assisting layers $3b_1$ and $3b_2$ are critical parameters.

Figure 13:
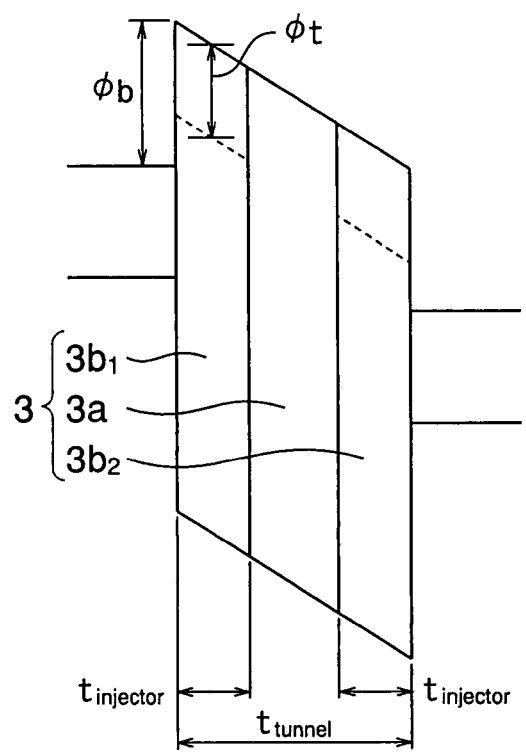
FIG. 13 is a schematic view of a tunnel insulating film that is used for explaining the preferred relationship between the layer thickness of the injection assisting layer and the depth of the injection assisting level.
Figure 14:
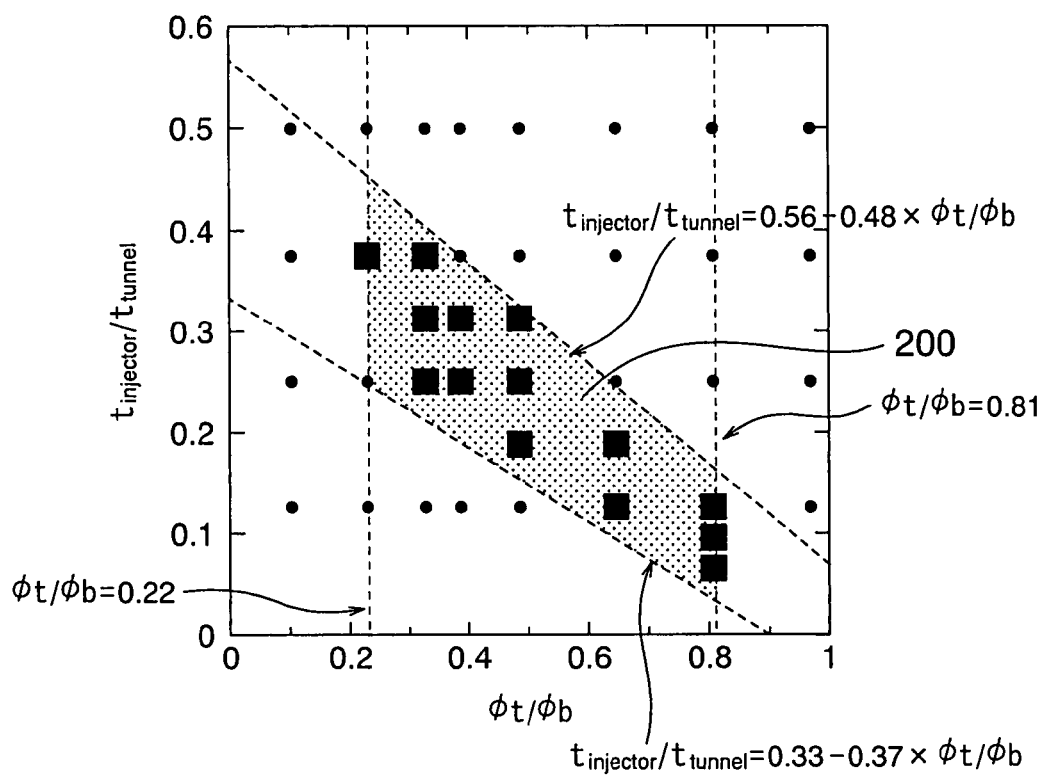
FIG. 14 is a characteristic chart showing the preferred relationship between the layer thickness of the injection assisting layer and the depth of the injection assisting level.

With the above facts being taken into account, the preferred ranges of the depth $\phi_t$ of each injection assisting level of the injection assisting layers $3b_1$ and $3b_2$ and the layer thickness $t_{injector}$ in this embodiment were examined. Where the depth $\phi_t$ and the layer thickness $t_{injector}$ are within such preferred ranges, the electron injection efficiency on the higher electric field side can be increased while data retention characteristics are maintained. FIG. 13 and FIG. 14 show the results of the examination. FIG. 13 is a schematic view of a tunnel insulating film that is used for explaining the preferred relationship between the layer thickness of the injection assisting layer and the depth of the injection assisting level with respect to the conduction band of the tunnel insulating film and FIG. 14 is a characteristic chart showing the preferred relationship between the layer thickness of the injection assisting layer and the depth of the injection assisting level with respect to the conduction band of the tunnel insulating film.

First, in FIG. 13, $t_{tunnel}$ represents the film thickness of the tunnel insulating film 3, $t_{injector}$ represents the layer thickness of each of the injection assisting layers $3b_1$ and $3b_2$, $\phi_t$ represents the depth of each injection assisting level of the injection assisting layers $3b_1$ and $3b_2$, and $\phi_b$ represents the energy barrier of silicon and the tunnel insulating film 3. FIG. 14 shows the preferred ranges of the depth $\phi_t$ of each injection assisting level and the layer thickness $t_{injector}$. In FIG. 14, the abscissa axis (the X-axis) indicates the ratio ($\phi_t/\phi_b$) of the level depth of each injection assisting layer to the energy barrier of the tunnel insulating film 3, and the ordinate axis (the Y-axis) indicates the ratio ($t_{injector}/t_{tunnel}$) of the layer thickness of each injection assisting layer to the film thickness of the tunnel insulating film 3. In FIG. 14, the black squares represent cases where it is possible to increase the electron injection efficiency on the higher electric field side (or to achieve the effect of lowering the write/erase voltage) while maintaining data retention properties on the lower electric field side (or achieving the effect of reducing the leakage current). The dots represent cases where at least one of the effects can be achieved. As can be seen from FIG. 14, if the ratio $t_{injector}/t_{tunnel}$ and the ratio $\phi_t/\phi_b$ fall within the region 200 in which the four inequations of X≥0.22, X≤0.81, Y>0.33-0.37X, and Y<0.56-0.48X are satisfied, it is possible to achieve both an increase in electron efficiency (or a decrease in write/erase voltage) and a decrease in leakage current on the lower electric field side (or improvement in data retention characteristics (charge retention properties)). The above four inequations were selected under the conditions that the electric field $I_{ox}$ of the tunnel insulating film is lower, if only a little, than the electric field in a case where the leakage current at 4 MV/cm is equal to or smaller than $1 \times 10^{-16}$ A/cm$^2$, and the electric filed with which the current density of Jg=0.1 A/cm$^2$ is achieved at the time of writing is lower, if only a little, than the electric field in a case (the case of Comparative Example 1) where the tunnel insulating film made of SiO$_2$ does not include any injection assisting layer.

Figure 15:
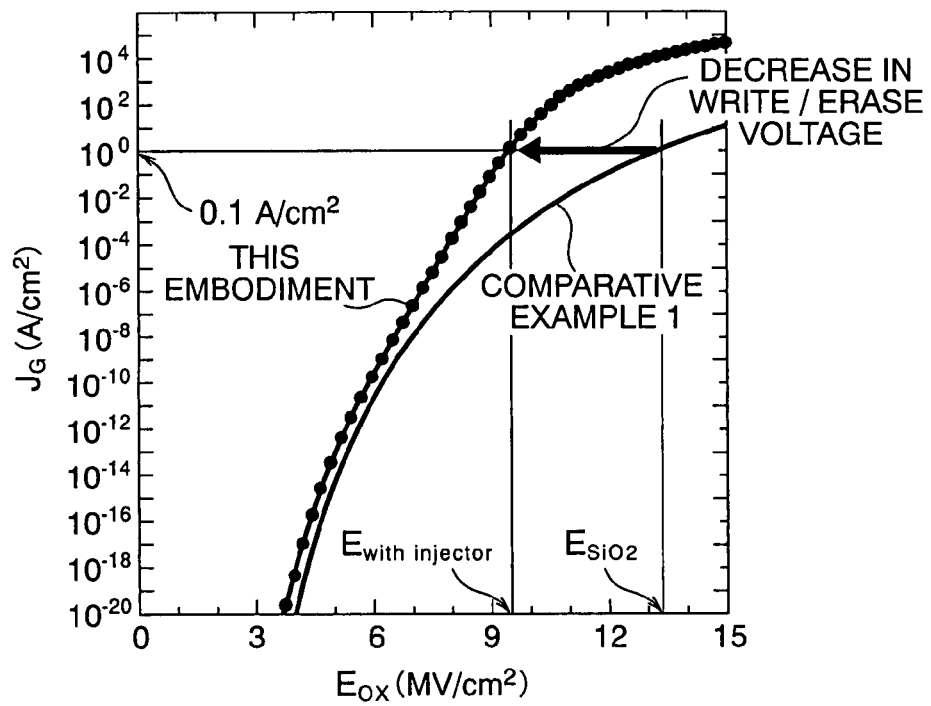
FIG. 15 is a diagram for explaining the write field decreasing rates.

Referring now to FIG. 15, the decreasing rate in write voltage is described. FIG. 15 shows the current-field characteristics observed in this embodiment (also shown in FIG. 6) and Comparative Example 1 (where only a FN tunneling current flows in the tunnel insulating film). The decreasing rate in write voltage of this embodiment with respect to Comparative Example 1 is the value obtained by dividing the difference between the electric field $E_{SiO2}$ of the tunnel insulating film of Comparative Example 1 and the electric field $E_{with\ injector}$ of the tunnel insulating film of this embodiment by the electric field $E_{SiO2}$ of the tunnel insulating film of Comparative Example 1, and multiplying the result by 100, where the tunnel current $J_G$=0.1 A/cm$^2$ flows.

Figure 16:
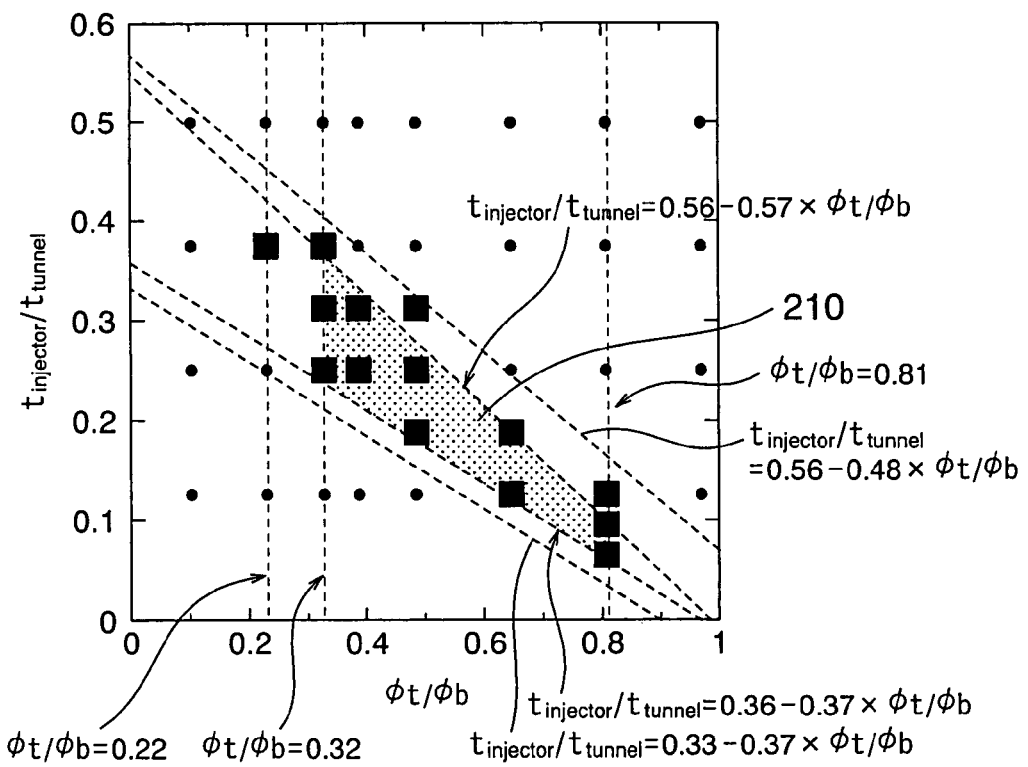
FIG. 16 is a characteristic chart showing the relationship between the layer thickness of the injection assisting layer and the depth of the injection assisting level.

To achieve a write voltage decreasing rate of 10% or higher at the time of writing with respect to Comparative Example 1 (where the tunnel insulating film does not include any injection assisting layer and is made of SiO$_2$) while satisfying the conditions illustrated in FIG. 14, the ratio $t_{injector}/t_{tunnel}$, and the ratio $\phi_t/\phi_b$ should fall within the region 210 in which the four inequations of X≥0.32, X≤0.81, Y≥0.36-0.37X, and Y≤0.56-0.57X are satisfied, as shown in FIG. 16. More preferably, the injection assisting level of the tunnel insulating film should be designed to exist within the region 210. FIG. 16 is a characteristic chart showing the relationship between the layer thickness of the injection assisting layer and the depth of the injection assisting level with respect to the conduction band of the tunnel insulating film, where the write field decreasing rate is 10 or higher.

Figure 17:
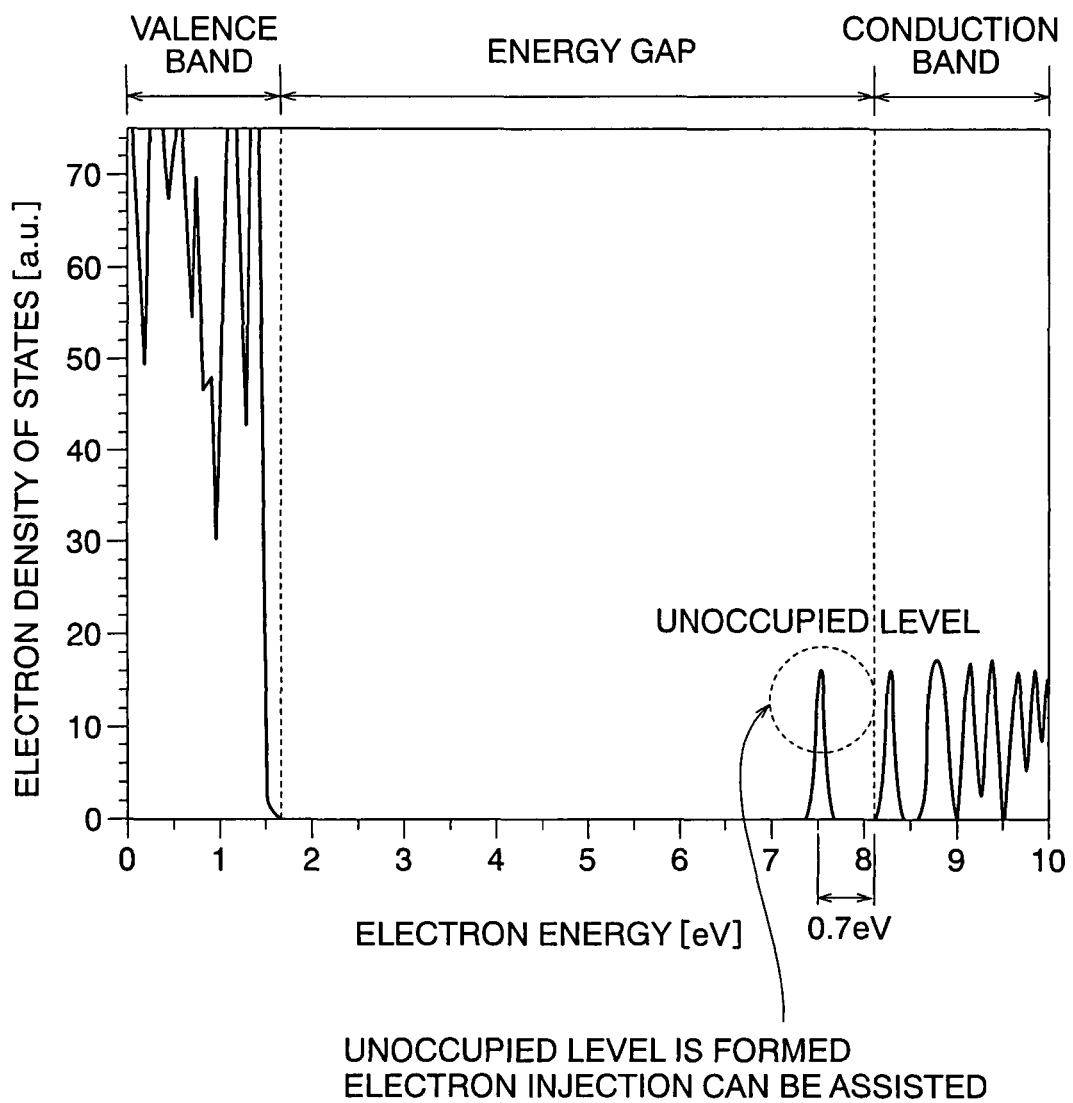
FIG. 17 shows the relationship between the electron energy and the electron density of states, where germanium exists in a Si substitution site in $SiO_2$.

In this embodiment, an additive is added so as to form injection assisting levels in the silicon oxide layers $3b_1$ and $3b_2$ as the upper and lower layers of the tunnel insulating film 3. FIG. 17 shows the result of a calculation carried out to determine the level formed in the band gap in a silicon oxide film where germanium is added to SiO$_2$ ($\alpha$-quartz). In the calculation, the electron density of states and the energy where germanium is added as an additive to a silicon oxide film ($\alpha$-quartz, 2×2×2 cells) are determined by the spin polarization GGA-DFT.

Figure 18:
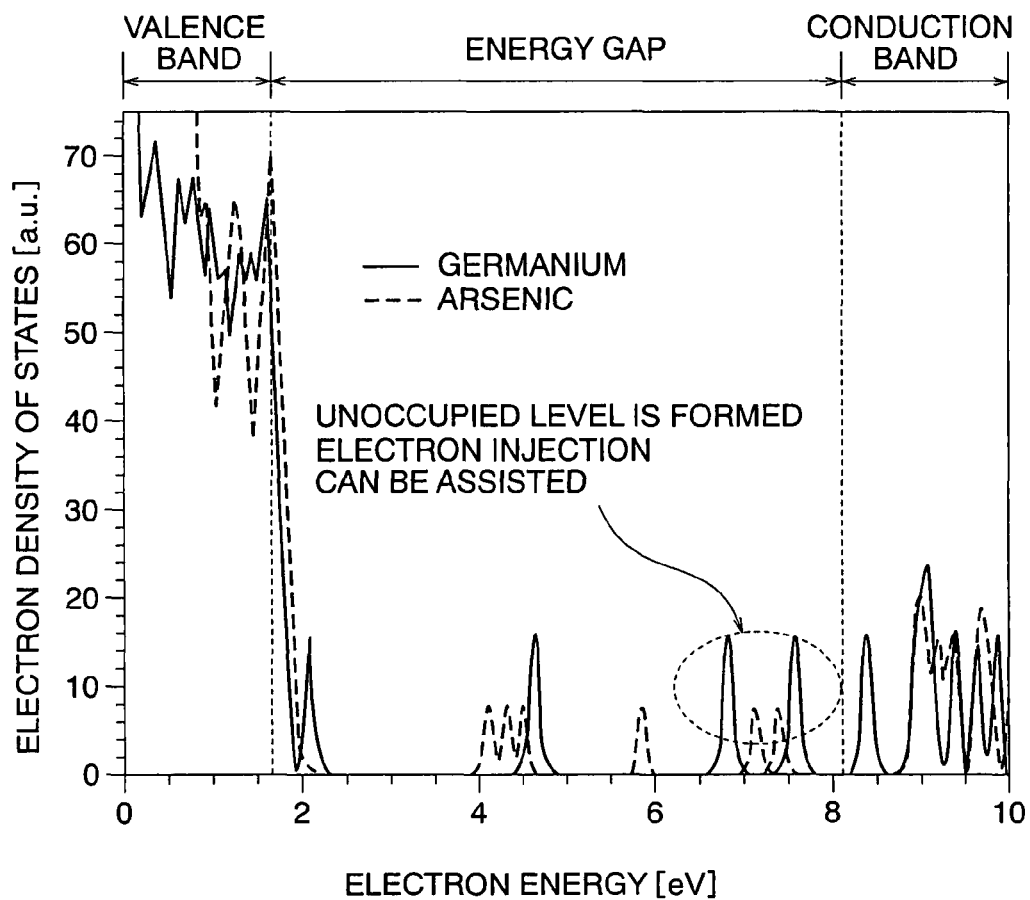
FIG. 18 shows the relationship between the electron energy and the electron density of states, where germanium or arsenic exists in an interstitial site in $SiO_2$.
Figure 19:
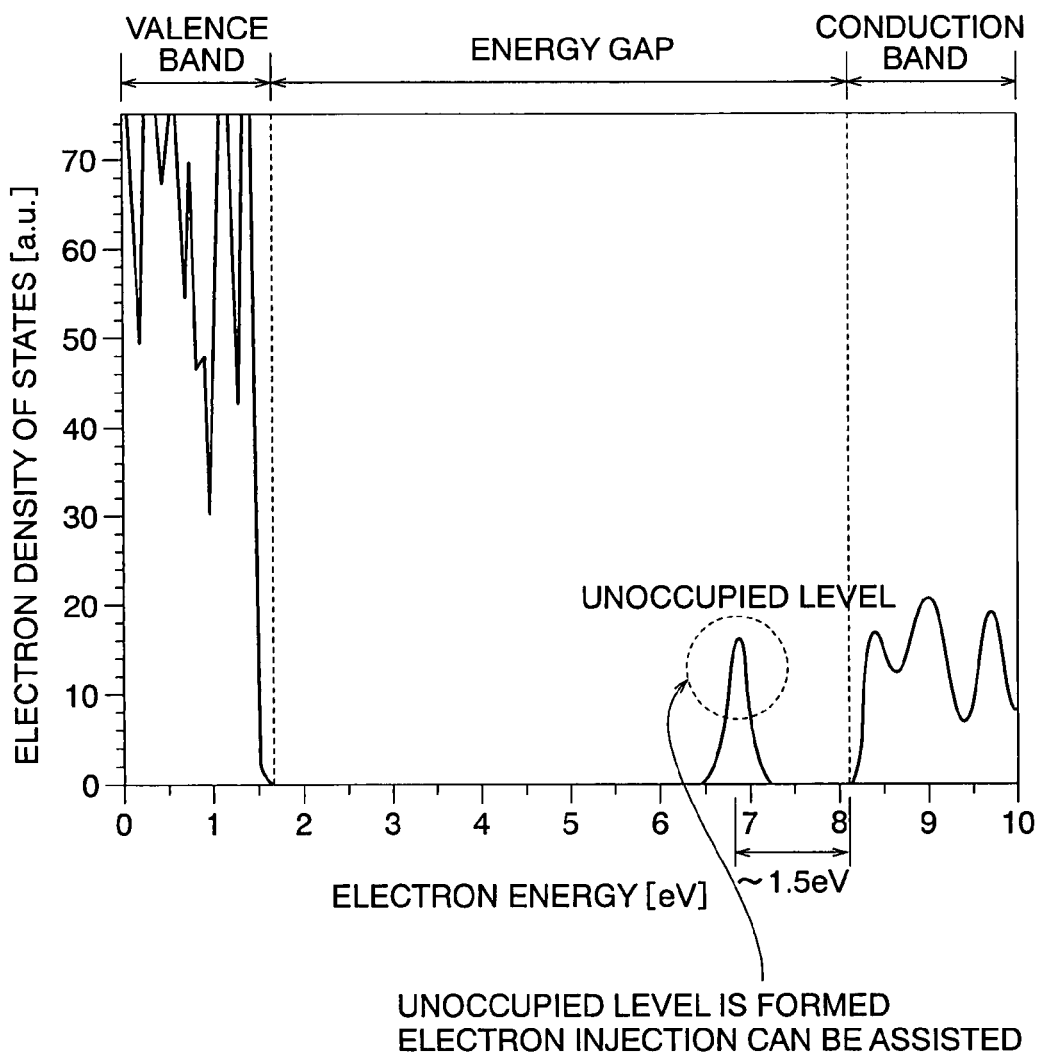
FIG. 19 shows the relationship between the electron energy and the electron density of states, where phosphorus exists in an interstitial site in $SiO_2$.

Here, an example case where germanium atoms are injected into the Si substitution site in a SiO$_2$ structure is described. As can be seen from this case, an unoccupied energy level is formed at the depth $\phi_T$ of approximately 0.7 eV from the conduction band minimum of a silicon oxide film. An unoccupied level is an energy level at which electrons are not stuck in a steady state. More specifically, an unoccupied level is a state where electrons introduced from the silicon conduction band due to an applied voltage (field) can be conducted via the unoccupied energy level. In a case where germanium is introduced into the interstitial site of a SiO$_2$ structure, an unoccupied energy level as described above is also formed in the band gap of the silicon oxide film, as shown in FIG. 18, and electron injection can be assisted. Since the position of the energy level formed in the band gap varies between the interstitial site and the Si substitution site, the more suitable energy level position should be used, so as to realize a structure having the optimized range shown in FIG. 16. Other than germanium, arsenic or phosphorus may be used to achieve the same effects as above. FIG. 18 also shows a case where arsenic (As) is introduced into the interstitial site of a SiO$_2$ structure. In such a case, an unoccupied level is formed in a position of 1.5 eV to 2.5 eV from the lower end of the conduction band of the SiO$_2$ film, and the unoccupied level functions as an injection assisting level. In a case of phosphorus (P), an unoccupied level is also formed in a position of approximately 1.5 eV from the lower end of the conduction band of the SiO$_2$ film, and the unoccupied level functions as an injection assisting level, as shown in FIG. 19.

Figure 20:
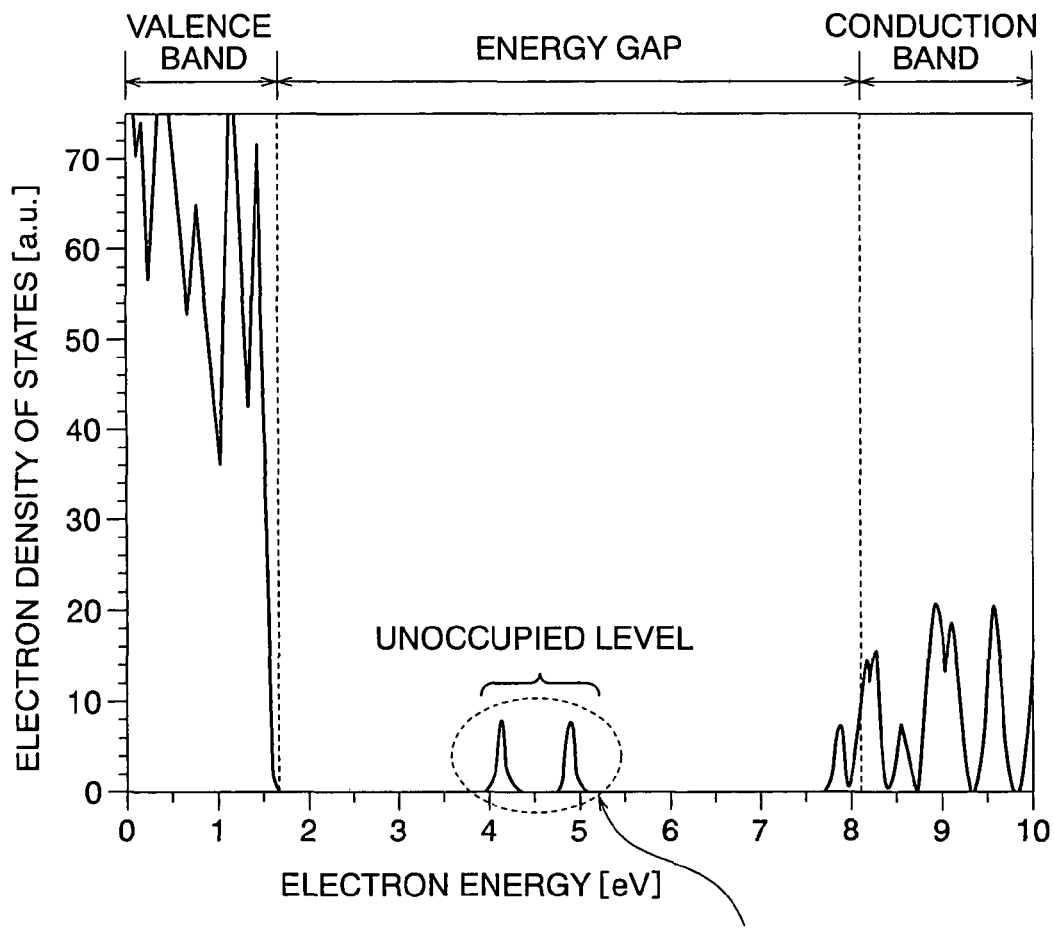
FIG. 20 shows the relationship between the electron energy and the electron density of states, where phosphorus or arsenic exists in a Si substitution site in $SiO_2$.

In a case where arsenic is introduced into the silicon substitution site in the SiO$_2$ film as in the case of germanium, an unoccupied level is formed in the band gap of the SiO$_2$ film, but the position of the unoccupied level formation is a position much deeper than the lower end of the conduction band of the SiO$_2$ film, as shown in FIG. 20. Therefore, the unoccupied level does not function as an injection assisting level.

As can be seen from the above facts, germanium should be introduced into the Si substitution site or the interstitial site in a SiO$_2$ structure, and arsenic and phosphorus should be introduced into the interstitial site.

Figure 21A:
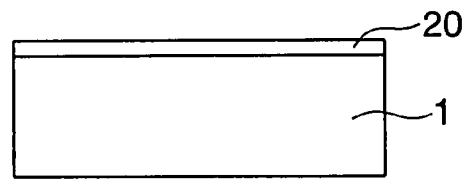
FIG. 21A through FIG. 21E are cross-sectional views for explaining the procedures for forming the tunnel insulating film according to the first embodiment.
Figure 21B:
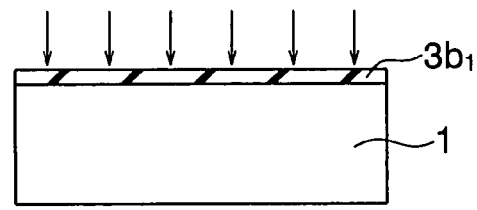

In a case where germanium is to be introduced into a silicon oxide film, a mixed layer 20 that is made of silicon and germanium and has a thickness of approximately 2 nm is formed on the silicon substrate 1, as shown in FIG. 21A. The surface of the mixed layer 20 is oxidized by performing burning oxidation using hydrogen and oxygen at 750° C., for example, so that the thickness of the mixed layer 20 is reduced to a desired film thickness. In this manner, the silicon oxide layer $3b_1$ is formed (see FIG. 21B). In this case, the germanium existing on the surface is introduced into the silicon oxide layer $3b_1$, and an injection assisting level is formed in the silicon oxide layer $3b_1$.

Figure 21C:
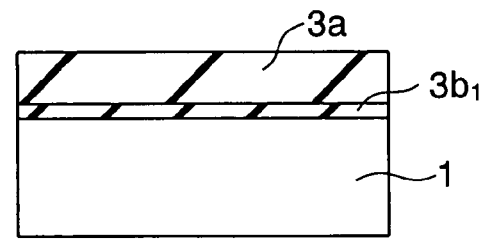
Figure 21D:
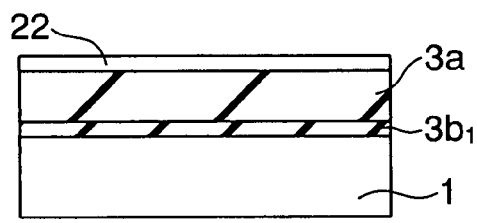
Figure 21E:
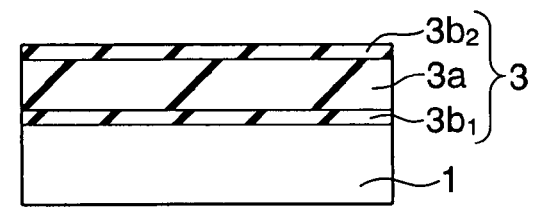

A silicon layer having a desired thickness is then formed as shown in FIG. 21C, and the silicon layer is oxidized to form the silicon oxide layer 3a not having an injection assisting level. Another mixed layer 22 that is made of silicon and germanium and has a thickness of approximately 2 nm is formed on the silicon oxide layer 3a, as shown in FIG. 21D. The surface of the mixed layer 22 is oxidized by performing burning oxidation using hydrogen and oxygen at 750° C., for example, so as to form the silicon oxide layer $3b_2$ having an injection assisting level (see FIG. 21E).

In this manner, the tunnel insulating film 3 having the layers $3b_1$ and $3b_2$ as the upper and lower layers including germanium injection assisting levels can be formed.

In the above described manufacture of the tunnel insulating film, burning oxidation using oxygen and hydrogen is performed. However, the present invention is not limited to this method, and radical oxidation, plasma oxidation, ECR plasma oxidation can be utilized to achieve the same effects as above.

In the above example, each of the mixed layers made of silicon and germanium, and the silicon layer is oxidized in one process. However, the present invention is not limited to that, and a few procedures may be carried out. For example, where the layers are formed as atomic layer units by the ALD (Atomic Layer Deposition) method, the interface layers $3b_1$ and $3b_2$ and the intermediate layer 3a may be formed by repeating film formation and oxidation of a mixed layer of silicon and germanium, and by repeating oxidation of a silicon layer, so as to achieve the desired film thickness with high controllability. In a case where nitride is used for the tunnel insulating film, other than the procedure for forming each of the layers $3b_1$, $3b_2$, and 3a in one process, the procedure for forming a silicon nitride film by performing plasma nitridation or thermal nitridation on a mixed layer of silicon and germanium or on a silicon layer is repeated a few times, so as to achieve a desired film thickness.

Other than germanium, elements such as hafnium, aluminum, and zirconium can form injection assisting levels. Those elements for forming injection assisting levels should be introduced with such concentration as not to change the band gap of the tunnel insulating film serving as the base material, and, more preferably, desired effects can be achieved with introduction concentration of 10% or less.

As described above, in accordance with this embodiment, the program voltage (write/erase voltage) can be lowered while the stress-induced leakage current is reduced.

(Second Embodiment)

Referring now to FIG. 22A through FIG. 23D, a method for manufacturing a nonvolatile semiconductor memory device in accordance with a second embodiment of the present invention is described.

Figure 22A:
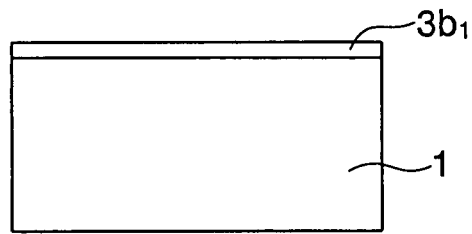
FIG. 22A through FIG. 22E are cross-sectional views for explaining a method for manufacturing a nonvolatile semiconductor memory device according to a second embodiment.
Figure 22B:
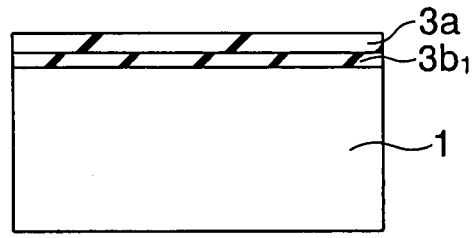
Figure 22C:
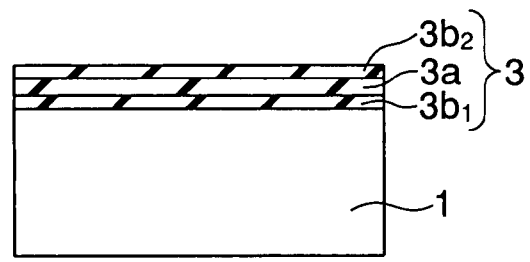
Figure 22D:
Figure 22E:
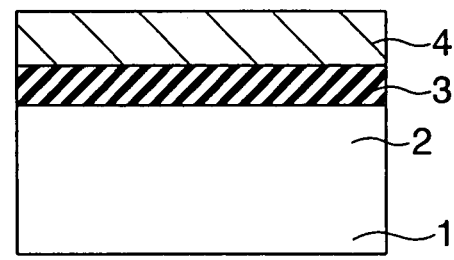

First, as shown in FIG. 22A, a p-type silicon substrate 1 with a plane orientation (100) and resistivity of 10 to 20 Ωcm is prepared, and a silicon oxide layer $3b_1$ containing germanium, for example, is formed on the surface of the p-type silicon substrate 1. A silicon oxide layer 3a not containing germanium is then formed, as shown in FIG. 22B. A silicon oxide layer $3b_2$ containing germanium is then stacked, as shown in FIG. 22C. In this manner, a tunnel insulating film 3 having a layer including an injection assisting level of germanium at either interface is completed, as shown in FIG. 22D. Although the tunnel insulating film 3 is formed with silicon oxide layers in this embodiment, it is possible to employ silicon nitride layers or silicon oxynitride layers, instead of the silicon oxide layers. An n-type polycrystalline silicon film 4 that is to be a floating gate electrode, has a thickness of 200 nm, and has an phosphorus additive added thereto is deposited on the tunnel insulating film 3, as shown in FIG. 22E.

Figure 23A:
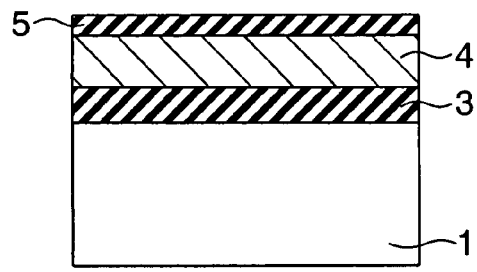
FIG. 23A through FIG. 23D are cross-sectional views for explaining a method for manufacturing a nonvolatile semiconductor memory device according to the second embodiment.
Figure 23B:
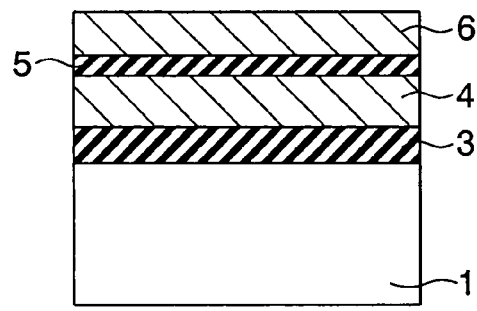

Next, as shown in FIG. 23A, an ONO film 5 that has a thickness of 7 nm and is formed with a stack consisting of a silicon oxide film, a silicon nitride film, and a silicon oxide film is formed on the polycrystalline silicon film 4. An n-type polycrystalline silicon film 6 that is to be a control gate electrode film, has a thickness of 200 nm, and has a phosphorus additive added thereto is then deposited on the ONO film 5, as shown in FIG. 23B.

Figure 23C:
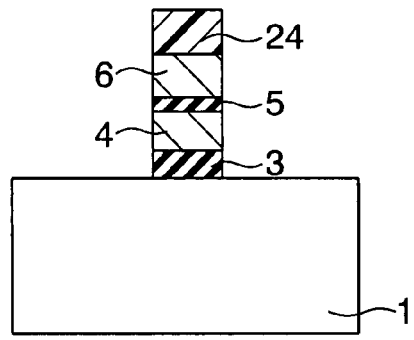

A photoresist is then applied onto the polycrystalline silicon film 6, and the photoresist is exposed and developed, so as to form a resist mask 24 (FIG. 23C). Using the resist mask 24, patterning is then performed on the polycrystalline silicon film 6, the ONO film 5, the polycrystalline silicon film 4, and the tunnel insulating film 3 by reactive ion etching. In this manner, a gate is formed.

Figure 23D:
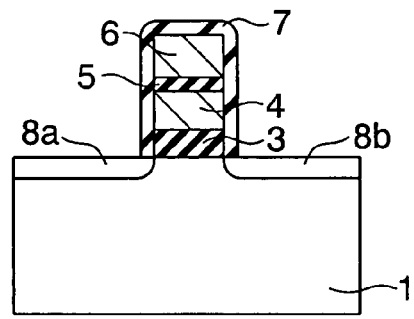

After the resist mask 24 is removed, heat treatment is carried out in an oxygen atmosphere, for the purpose of a recovery from damage due to the processing. As a result, a post-oxidation film 7 of approximately 3 nm is formed. Phosphorus ions are injected at $3 \times 10^{15}$ cm$^{-2}$ into the entire surface, and heat treatment is carried out at 1000° C. for 20 seconds, so as to diffuse and activate the phosphorus ions in the silicon substrate. In this manner, diffusion layers 8a and 8b to be the source and drain regions are formed, and the structure shown in FIG. 23D is produced.

Although not particularly shown in the drawings, a 300-nm thick silicon oxide film is then deposited as an interlayer insulating film on the entire surface by CVD method, and contact holes are formed in the silicon oxide film by anisotropic dry etching. After an 800-nm thick aluminum film containing 0.5% of silicon and 0.5% of copper is formed, patterning is performed on the aluminum film, so as to form an electrode. Heat treatment is then carried out in a nitrogen atmosphere containing 10% of hydrogen at 450° C. for 15 minutes.

By the above described manufacturing method, germanium is introduced between silicon lattices, and a memory element that includes the tunnel insulating film 3 having the insulating film layers $3b_1$ and $3b_2$ with injection assisting levels at both interfaces can be obtained. Accordingly, the write electric field is lowered, and the device characteristics are improved. Furthermore, the reliability can be increased.

In the above described example, germanium is used as the element for forming the injection assisting levels. However, the material for forming the injection assisting levels is not limited to that, and the injection assisting levels can also be formed with phosphorus, arsenic, hafnium, or zirconium. Also, in the above described example, an ONO film is used as the interelectrode insulating film or the insulating film 5 located between the control gate electrode and the floating gate electrode. However, the insulating film 5 is not limited to an ONO film, and a high-permittivity insulating film layer or a stack structure consisting of a high-permittivity insulating film and an insulating film such as a silicon oxide film or a silicon nitride film may be used to achieve the same effects as above. In a case where such a high-permittivity insulating film is used as the interelectrode insulating film, the electric film thickness of the interelectrode insulating film decreases (or the capacity increases), and the coupling ratio with respect to the tunnel insulating film becomes higher. Thus, the write/erase voltage can be lowered.

In this embodiment, the tunnel insulating film having insulating layers including injection assisting levels in both interface positions is formed in the following manner. A 1-nm thick silicon germanium layer is deposited on the surface of the silicon substrate by CVD method with the use of a mixed gas of a $SiH_4$ gas and a $GeH_4$ gas, for example, and the silicon germanium layer is oxidized to form a germanium-added silicon oxide film. A silicon oxide film of approximately 5 nm is then deposited by the ALD method, for example. Another 1-nm thick silicon germanium layer is then deposited by CVD method with the use of a mixed gas of a $SiH_4$ gas and a $GeH_4$ gas, for example, and the silicon germanium layer is oxidized to form a germanium-added silicon oxide film. In this manner, the layers each having an injection assisting level formed with germanium are formed at both interfaces of the silicon oxide film.

Figure 24:
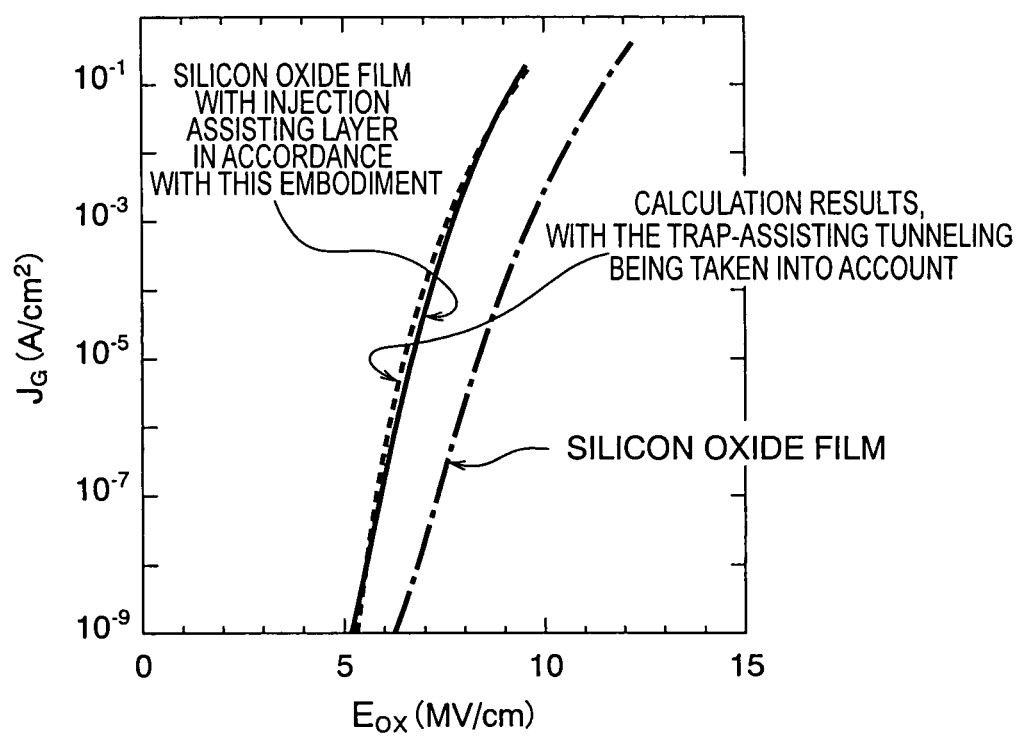
FIG. 24 shows the current-field characteristics of a MOS capacitor that is manufactured by the manufacturing method according to the second embodiment.

FIG. 24 shows the current-voltage characteristics of a MOS capacitor manufactured by the method of the embodiment. As shown in FIG. 24, where the injection current is set at 0.1 $A/cm^2$, for example, the MOS capacitor manufactured by the method of this embodiment can have a voltage decrease of approximately 3 MV/cm, compared with a MOS capacitor having silicon oxide films not including injection assisting levels. Meanwhile, the noise level of a measurement device is $1 \times 10^{-9}$ $A/cm^2$ in actual measurement, and a current value smaller than that cannot be observed. However, the fitting results (indicated by the dotted line in FIG. 24) of simulations using experimental values confirm that the leakage current on the lower electric field side can be restrained.

In the above example, the tunnel insulating film containing germanium as the element for forming the injection assisting levels is formed in the following manner. Silicon germanium layer are deposited by CVD method with the use of a mixed gas of a $SiH_4$ gas and a $GeH_4$ gas, and the silicon germanium layers are oxidized to form germanium-added silicon oxide films. However, the film forming technique is not limited to that, and germanium-containing insulating layers may be immediately formed by the ALD method, for example, with the use of an organic source gas containing silicon, another organic source gas containing germanium, and an oxidized gas. With such germanium-containing insulating layers, the same effects as above can be achieved. Alternatively, the film deposition may be carried out by CAT-CVD method.

By the tunnel insulating film manufacturing method illustrated in FIG. 21A through FIG. 21E, each silicon oxide layer containing germanium is formed by oxidizing a silicon germanium layer. The oxidized gas used in the oxidation should preferably be able to carry out an oxidizing process, such as radical oxidation, ozone oxidation, or $H_2O$ oxidation, at a lower temperature than the temperature for dry oxidation using $O_2$. In this manner, oxidation is carried out at a low temperature, and germanium diffusion is restrained accordingly. Thus, germanium can be introduced as the injection assisting levels with efficiency. Dry oxidation at a high temperature may be carried out. In such a case, however, germanium is scattered, and is not easily introduced into the silicon oxide films. As a result, it becomes difficult to form a tunnel insulating film having desired characteristics.

(Third Embodiment)

Referring now to FIG. 25A through FIG. 26B, a method for manufacturing a MONOS (Metal-Oxide-Nitride-Oxide-Silicon)-type or SONOS (Silicon-Oxide-Nitride-Oxide-Silicon)-type nonvolatile semiconductor memory device in accordance with a third embodiment of the present invention is described.

Figure 25A:
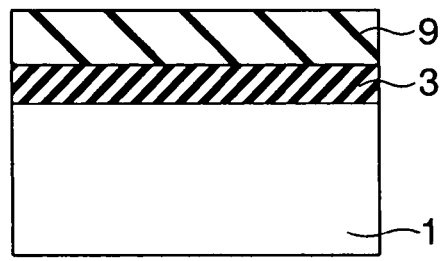
FIG. 25A through FIG. 25C are cross-sectional views for explaining a method for manufacturing a nonvolatile semiconductor memory device according to a third embodiment.

First, the procedures in accordance with the second embodiment are carried out, up to the point where the tunnel insulating film that has the layers including the injection assisting levels formed with germanium at both interfaces is formed. A 10-nm thick silicon nitride film 9 is then formed as a charge storage layer on the tunnel insulating film 3, with the use of a mixed gas of a $NH_3$ gas and a $SiH_2Cl_2$ or $Si_2Cl_6$ gas, as shown in FIG. 25A.

Figure 25B:
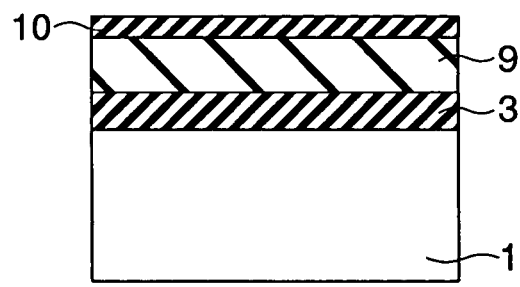

A 15-nm thick block insulating film layer 10 is then formed on the silicon nitride film 9, as shown in FIG. 25B. This block insulating film layer 10 is formed by depositing a silicon oxide film by CVD method, for example.

Figure 25C:
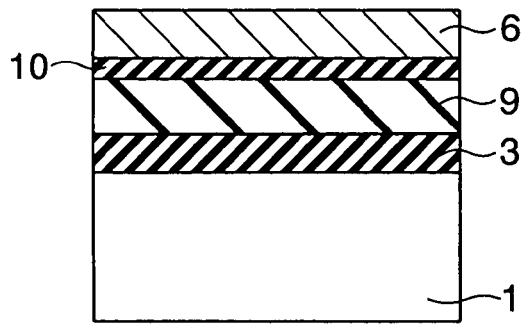

A conductor layer 6 such as a 200-nm thick n-type polycrystalline silicon film having phosphorus added there to or a nickel silicide layer or a metal layer is deposited as the control gate electrode on the block insulating film layer 10, as shown in FIG. 25C.

Figure 26A:
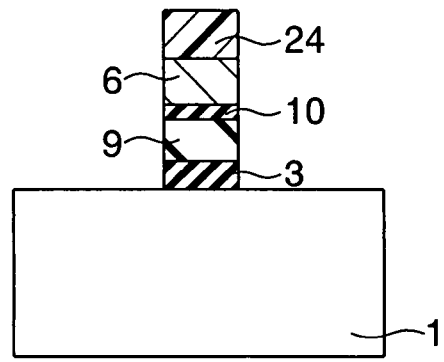
FIG. 26A and FIG. 26B are cross-sectional views for explaining a method for manufacturing a nonvolatile semiconductor memory device according to the third embodiment.

A photoresist is then applied onto the conductor layer 6, and the photoresist is exposed and developed so as to form a resist mask 24 (FIG. 26A). As shown in FIG. 26A, using the resist mask 24, etching is performed on the conductor layer 6, the block insulating film 10, the silicon nitride layer 9, and the tunnel insulating film 3 by reactive ion etching, so as to form the gate portion.

Figure 26B:
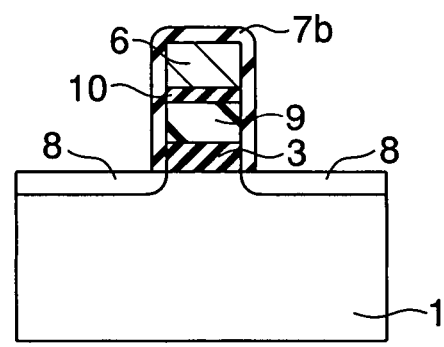

After the resist mask 24 is removed, a silicon nitride film 7b of approximately 5 nm, for example, is formed as a protection film for the gate portion (FIG. 26B). Phosphorus ions are then injected at $3 \times 10^{15}$ $cm^{-2}$ into the entire surface, and heat treatment is carried out at 1000° C. for 20 seconds, so as to diffuse and activate the phosphorus ions in the silicon substrate. In this manner, diffusion layers 8a and 8b to be the source and drain regions are formed, and the structure shown in FIG. 26B is produced.

Although not specifically shown in the drawings, a 300-nm thick silicon oxide film is then deposited as an interlayer insulating film on the entire surface by CVD method, and contact holes are formed in the silicon oxide film by anisotropic dry etching. After an 800-nm thick aluminum film containing 0.5% of silicon and 0.5% of copper is formed, patterning is performed on the aluminum film, so as to form an electrode. Heat treatment is then carried out in a nitrogen atmosphere containing 10% of hydrogen at 450° C. for 15 minutes.

In this manner, a MONOS- or SONOS-type nonvolatile semiconductor memory that has a tunnel insulating film including germanium as the injection assisting levels can be produced. In this case, the write voltage in a high electric field can be made lower, and the amount of leakage current in a low electric field that affects the data retention characteristics (charge retention properties) can be made smaller than in a case where the tunnel insulating film is formed with a conventional silicon oxide film or a silicon oxynitride film. In addition to that, the source voltage is lowered as the write voltage is lowered, and the voltage to be applied to the tunnel insulating film and the block insulating film layer is lowered. Thus, a highly-reliable nonvolatile memory can be produced.

In a SONOS-type nonvolatile memory, it is difficult to pull electrons out of the charge storage layer at the time of erasing, and a long erasing time is required, as is known as a problem. To counter this problem, an electron cramming state is formed on the lower end side of the band gap (or in the vicinity of approximately 2 eV to 3 eV from the top end of the valence band) at the germanium electron density of states, as shown in FIG. 18. This electron cramming state can serve as a hole injection assisting level. Accordingly, using this state, holes are injected from the substrate side into the charge storage layer via the tunnel insulating film at the time of erasing. Thus, high-speed erasing can be performed with a low electric field.

The block insulating film layer of this embodiment is a silicon oxide film. However, it is possible to use an oxide or an oxynitride containing at least one of the following elements: hafnium, zirconium, aluminum, and lantern. Those elements are preferred in view of the permittivity and the leakage current characteristics.

Also, a silicon nitride film is used as the charge storage layer in this embodiment. To further increase the charge storage amount, however, it is possible to use a so-called silicon-rich nitride film having a larger silicon composition than the stoichiometric composition. By doing so, further improved characteristics can be achieved.

As described so far, in accordance with each of the embodiments of the present invention, injection assisting levels are formed in the tunnel insulating film in a nonvolatile semiconductor memory device or the like, so as to reduce leakage current in lower electric fields (charge retaining fields) or preventing degradation in charge retention properties due to charge leakage while lowering the write voltage. With this arrangement, the source voltage (program voltage) of the device can be lowered, and the device can be made smaller in size. At the same time, the reliability of the device characteristics can be increased.

Although each substrate used in the first through third embodiments is a silicon semiconductor substrate, it is also possible to employ a Ge substrate, a SiGe substrate, or a III-V semiconductor substrate. In a case where a Ge substrate or a SiGe substrate is employed, when the tunnel insulating film is formed with $SiO_2$ or a SiN-based material, the additive element for forming the injection assisting sites is As or P. When the tunnel insulating film is formed with a high-k film such as a $HfO_2$ film in the same case, the additive element is Al, Si, or P. In a case where a III-V semiconductor substrate is employed, when the tunnel insulating film is formed with $SiO_2$ or a SiN-based material, the additive element for forming the injection assisting sites is Ge, As or P. When the tunnel insulating film is formed with a high-k film such as a $HfO_2$ film in the same case, the additive element is Al, Si, or P.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile semiconductor memory device comprising a memory element,
the memory element including:
a semiconductor layer;
a source region and a drain region formed at a distance from each other in the semiconductor layer;
a tunnel insulating film formed on a region in the semiconductor layer located between the source region and the drain region, and having a stack structure formed with a first insulating layer, a second insulating layer, and a third insulating layer in this order, the first insulating layer including an electron trapping site, the second insulating layer not including the electron trapping site, the third insulating layer including the electron trapping site, and the electron trapping site being located in a position lower than a conduction band minimum of the first through third insulating layers while being located in a position higher than the conduction band minimum of a material forming the semiconductor layer, the conduction band minimum of the tunnel insulating film being constant in a film thickness direction across the first, second, and third insulating layers;
a charge storage film formed on the tunnel insulating film;
an insulating film formed on the charge storage film; and
a control gate electrode formed on the insulating film.

2. The memory device according to claim 1, wherein the charge storage film is a floating gate electrode.

3. The memory device according to claim 1, wherein the charge storage film is a charge trap dielectric.

4. The memory device according to claim 1, wherein the tunnel insulating film has an electron energy barrier that is uniform in a film thickness direction.

5. The memory device according to claim 4, wherein:
the first and third insulating layers have the same layer thickness $t_{injector}$; and
a ratio $t_{injector}/t_{tunnel}$ and a ratio $\Phi_t/\Phi_b$ fall within a range in which the four inequalities of $X \geq 0.22$, $X \leq 0.81$, $Y > 0.33 - 0.37X$, and $Y < 0.56 - 0.48X$ are satisfied in a coordinate system with the Y-axis indicating the ratio $t_{injector}/t_{tunnel}$ between the layer thickness $t_{injector}$ and a film thickness $t_{tunnel}$ of the tunnel insulating film, and the X-axis indicating the ratio $\Phi_t/\Phi_b$ between an energy depth $\Phi_t$ of the electron trapping site from the conduction band minimum of the first through third insulating layers and the energy barrier $\Phi_b$ of the tunnel insulating film.

6. The memory device according to claim 5, wherein the ratio $t_{injector}/t_{tunnel}$ and the ratio $\Phi_t/\Phi_b$ fall within a range in which the four inequations of $X \geq 0.32$, $X \leq 0.81$, $Y \geq 0.36 - 0.37X$, and $Y \leq 0.56 - 0.57X$ are satisfied.

7. The memory device according to claim 1, wherein the semiconductor layer is a silicon layer, the first through third insulating layers are formed with silicon and oxygen, or formed with silicon, oxygen and nitrogen, and the first and third insulating layers contain at least one element selected from the group consisting of germanium, arsenic and phosphorus.

8. The memory device according to claim 1, wherein the semiconductor layer is a Ge layer or a SiGe layer;
when the first through third insulating layers are formed with silicon and oxygen, or formed with silicon and nitrogen, the first and third insulating layers contain at least one element selected from the group consisting of arsenic and phosphorus, and
when the first through third insulating layers are formed with a high-k film, the first and third insulating layers contain at least one element selected from the group consisting of aluminum, silicon and phosphorus.

9. A nonvolatile semiconductor memory device comprising at least one memory element,
the memory element including:
a silicon semiconductor layer;
a source region and a drain region formed at a distance from each other in the silicon semiconductor layer;
a tunnel insulating film formed on a region in the silicon semiconductor layer located between the source region and the drain region, and having a stack structure formed with a first insulating layer, a second insulating layer, and a third insulating layer in this order, each of the first and third insulating layers consisting essentially of silicon oxynitride and phosphorus, and the second insulating layer consisting essentially of one of silicon oxide and silicon oxynitride;

a charge storage film formed on the tunnel insulating film;

an insulating film formed on the charge storage film; and a control gate electrode formed on the insulating film.

10. The memory device according to claim 9, wherein the charge storage film is a floating gate electrode.

11. The memory device according to claim 9, wherein the charge storage film is a charge trap dielectric.

12. The memory device according to claim 9, wherein the phosphorus exists in a silicon substitution site or between lattices.

13. The memory device according to claim 9, further comprising a NAND cell formed with the memory elements in series.

14. The memory device according to claim 9, wherein the source region and the drain region include phosphorus.

15. The memory device according to claim 9, wherein the charge storage film and the control gate electrode are formed with polycrystalline silicon.

16. The memory device according to claim 9, wherein the charge storage film is a floating gate electrode, and the floating gate electrode has a phosphorus additive added thereto.

17. The memory device according to claim 9, wherein the control gate electrode has a phosphorus additive added thereto.

18. The memory device according to claim 9, wherein the source region and the drain region include phosphorus, the charge storage film is a floating gate electrode, and the floating gate electrode has a phosphorus additive added thereto.

* * * * *